(12) United States Patent
Yu et al.

(10) Patent No.: US 11,925,067 B2
(45) Date of Patent: Mar. 5, 2024

(54) DISPLAY PANEL AND DISPLAY DEVICE

(71) Applicant: BOE Technology Group Co., Ltd., Beijing (CN)

(72) Inventors: Yang Yu, Beijing (CN); Yipeng Chen, Beijing (CN); Ling Shi, Beijing (CN); Jingquan Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 492 days.

(21) Appl. No.: 17/271,249

(22) PCT Filed: May 11, 2020

(86) PCT No.: PCT/CN2020/089687
§ 371 (c)(1),
(2) Date: Feb. 25, 2021

(87) PCT Pub. No.: WO2021/226807
PCT Pub. Date: Nov. 18, 2021

(65) Prior Publication Data
US 2022/0130933 A1 Apr. 28, 2022

(51) Int. Cl.
*G09G 3/3233* (2016.01)
*G09G 3/3258* (2016.01)
(Continued)

(52) U.S. Cl.
CPC ....... *H10K 59/1216* (2023.02); *G09G 3/3233* (2013.01); *G09G 3/3258* (2013.01); *H01L 27/1255* (2013.01); *H10K 59/1213* (2023.02); *H10K 59/131* (2023.02); *H10K 59/353* (2023.02)

(58) Field of Classification Search
CPC ............. H10K 59/353; H10K 59/1213; H10K 59/121; H10K 59/131; H01L 27/1255;
(Continued)

(56) References Cited

U.S. PATENT DOCUMENTS 11,482,170 B2 * 10/2022 Feng ................... H01L 27/12
2016/0372023 A1 * 12/2016 Zhang ................. G09G 3/2092
(Continued)

FOREIGN PATENT DOCUMENTS

CN 110112193 A 8/2019
JP 2013109907 A 6/2013
(Continued)

OTHER PUBLICATIONS

Office Action in JP2021568553, dated Dec. 12, 2023, 14 pages.

*Primary Examiner* — Savitri Mulpuri
(74) *Attorney, Agent, or Firm* — ArentFox Schiff LLP; Michael Fainberg

(57) ABSTRACT

Disclosed are a display panel and a display device. The display panel includes a base substrate including a plurality of sub-pixels, at least one of the plurality of sub-pixels including a pixel circuit; a first conductive layer located on a side, facing away from the base substrate, of a first insulating layer; a second insulating layer located on a side, facing away from the base substrate, of the first conductive layer; a second conductive layer located on a side, facing away from the base substrate, of the second insulating layer; a fourth insulating layer located on a side, facing away from the base substrate, of the second conductive layer; and a third conductive layer located on a side, facing away from the base substrate, of the fourth insulating layer, the third conductive layer including a plurality of data wires arranged at intervals.

30 Claims, 21 Drawing Sheets

(51) Int. Cl.
*H01L 27/12* (2006.01)
*H10K 59/121* (2023.01)
*H10K 59/131* (2023.01)
*H10K 59/35* (2023.01)

(58) Field of Classification Search
CPC ......... G06G 3/3233; G06G 2310/0216; G06G 2300/0421; G06G 2320/045; G06G 2230/00
See application file for complete search history.

(56) References Cited

U.S. PATENT DOCUMENTS

| | | |
|---|---|---|
| 2018/0122832 A1 | 5/2018 | Lee et al. |
| 2018/0122888 A1 | 5/2018 | Jung et al. |
| 2018/0175077 A1 | 6/2018 | Koo et al. |
| 2019/0189723 A1 | 6/2019 | Kim et al. |
| 2019/0304374 A1* | 10/2019 | Wang .................... G09G 3/3233 |
| 2019/0385523 A1* | 12/2019 | Na ........................ G09G 3/3291 |
| 2021/0280659 A1* | 9/2021 | Park ..................... G09G 3/3233 |
| 2021/0407402 A1 | 12/2021 | Xu et al. |
| 2022/0367602 A1* | 11/2022 | Li ....................... H10K 59/1315 |
| 2022/0406260 A1* | 12/2022 | Pang ................... G09G 3/3266 |

FOREIGN PATENT DOCUMENTS

| | | |
|---|---|---|
| JP | 2018072813 A | 5/2018 |
| JP | 2018072840 A | 5/2018 |
| JP | 2019109511 A | 7/2019 |
| KR | 20180078813 A | 7/2018 |
| KR | 20190128801 A | 11/2019 |
| WO | 2019218713 A1 | 11/2019 |

\* cited by examiner

200

VINIT

410

420

400

DISPLAY PANEL AND DISPLAY DEVICE

CROSS-REFERENCE TO RELATED APPLICATIONS

This application is a National Stage of International Application No. PCT/CN2020/089687, filed on May 11, 2020, which is hereby incorporated by reference in its entirety.

FIELD

The present disclosure relates to the technical field of display, in particular to a display panel and a display device.

BACKGROUND

Organic Light Emitting Diode (OLED), Quantum Dot Light Emitting Diodes (QLED) and other electroluminescent diodes have the advantages of self-illumination and low energy consumption, and are one of the focuses of research on electroluminescent display devices.

SUMMARY

A display panel provided by embodiments of the present disclosure includes: a base substrate provided with a plurality of sub-pixels, at least one of the plurality of sub-pixels including a pixel circuit, where the pixel circuit includes a storage capacitor, an initialization transistor and a threshold compensation transistor; a silicon semiconductor layer located on the base substrate, the silicon semiconductor layer including a silicon active layer of a driving transistor, where the silicon active layer of the driving transistor is provided with a first electrode area, a second electrode area and a first channel area between the first electrode area and the second electrode area; a first insulating layer locate on a side, facing away from the silicon semiconductor layer, of the base substrate; a first conductive layer located on a side, facing away from the base substrate, of the first insulating layer, the first conductive layer including a plurality of scanning wires; a second insulating layer located on a side, facing away from the base substrate, of the first conductive layer; an oxide semiconductor layer located on a side, facing away from the base substrate, of the second insulating layer, the oxide semiconductor layer including an oxide active layer of the initialization transistor and an oxide active layer of the threshold compensation transistor, where the oxide active layer of the threshold compensation transistor is provided with a third electrode area, a fourth electrode area and a second channel area between the third electrode area and the fourth electrode area, and in each sub-pixel, a fourth electrode area of the oxide active layer of the initialization transistor and the fourth electrode area of the oxide active layer of the threshold compensation transistor are electrically connected to a gate of the driving transistor, and the third electrode area of the oxide active layer of the threshold compensation transistor is electrically connected to the second electrode area of the silicon active layer of the driving transistor; a third insulating layer located on a side, facing away from the base substrate, of the oxide semiconductor layer; a second conductive layer located on a side, facing away from the base substrate, of the third insulating layer; a fourth insulating layer located on a side, facing away from the base substrate, of the second conductive layer; and a third conductive layer located on a side, facing away from the base substrate, of the fourth insulating layer, the third conductive layer including a plurality of data wires arranged at intervals; where the storage capacitor is provided with three electrode plates which are stacked, and the three electrode plates are respectively arranged on the same layer together with the first conductive layer, the second conductive layer and the third conductive layer.

Optionally, in the embodiments of the present disclosure, the pixel circuit further includes a driving transistor, and the first conductive layer further includes a gate of the driving transistor; the second conductive layer includes a plurality of storage conductive parts arranged at intervals, where the sub-pixel includes the storage conductive parts; the third conductive layer further includes a plurality of first connecting parts arranged at intervals, where the sub-pixel includes the first connecting parts; and in the same sub-pixel, the gate of the driving transistor, the storage conductive part and the first connecting part serve as the three electrode plates of the storage capacitor.

Optionally, in the embodiments of the present disclosure, in the same sub-pixel, an orthographic projection of the storage conductive part on the base substrate and an orthographic projection of the gate of the driving transistor on the base substrate have a sixth overlapping area, and the first connecting part is electrically connected to the gate of the driving transistor; the storage conductive part serves as a first pole of the storage capacitor; and the first connecting part is electrically connected to the gate of the driving transistor and serves as a second pole of the storage capacitor.

Optionally, in the embodiments of the present disclosure, the storage conductive part has a hollowed-out area, and the orthographic projection of the gate of the driving transistor on the base substrate covers the hollowed-out area of the storage conductive part; a first terminal of the first connecting part is electrically connected to the fourth electrode area of the oxide active layer of the initialization transistor through a second via hole, and a second terminal of the first connecting part is electrically connected to the gate of the driving transistor through a third via hole; the second via hole penetrates through the third insulating layer and the fourth insulating layer; and the third via hole penetrates through the second insulating layer, the third insulating layer and the fourth insulating layer, and an orthographic projection of the third via hole on the base substrate is located within an orthographic projection of the hollowed-out area on the base substrate.

Optionally, in the embodiments of the present disclosure, an orthographic projection of the first connecting part on the base substrate covers the orthographic projection of the hollowed-out area on the base substrate.

Optionally, in the embodiments of the present disclosure, the third conductive layer further includes a plurality of power wires arranged at intervals; one column of sub-pixels includes the power wire, and in the same column, an orthographic projection of the power wire on the base substrate is located between an orthographic projection of the data wire on the base substrate and the orthographic projection of the first connecting part on the base substrate; and in the same sub-pixel, the power wire is electrically connected to the storage conductive part through a fourth via hole, and the fourth via hole penetrates through the fourth insulating layer.

Optionally, in the embodiments of the present disclosure, the display panel further includes: a fifth insulating layer located on a side, facing away from the base substrate, of the third conductive layer; and a fourth conductive layer located on a side, facing away from the base substrate, of the fifth insulating layer, the fourth conductive layer including a plurality of auxiliary conductive parts arranged at intervals, where the sub-pixel includes the auxiliary conductive part; and in the same sub-pixel, the auxiliary conductive part is electrically connected to the power wire through a fifth via hole, and an orthographic projection of the auxiliary conductive part on the base substrate is overlapped with the orthographic projection of the first connecting part on the base substrate, where the fifth via hole penetrates through the fifth insulating layer.

Optionally, in the embodiments of the present disclosure, in the same sub-pixel, the orthographic projection of the auxiliary conductive part on the base substrate covers the orthographic projection of the storage conductive part on the base substrate.

Optionally, in the embodiments of the present disclosure, in the same sub-pixel, the orthographic projection of the storage conductive part on the base substrate covers an orthographic projection of the fifth via hole on the base substrate.

Optionally, in the embodiments of the present disclosure, in the same column, the fourth via hole and the fifth via hole are located roughly on the same straight line in a column direction.

Optionally, in the embodiments of the present disclosure, in at least one of the plurality of sub-pixels, the fourth electrode area of the oxide active layer of the initialization transistor is shared with the fourth electrode area of the oxide active layer of the threshold compensation transistor, and the oxide active layer of the initialization transistor and the oxide active layer of the threshold compensation transistor extend roughly on the same straight line in the column direction of the sub-pixel.

Optionally, in the embodiments of the present disclosure, in the same row of sub-pixels, the oxide active layers of the initialization transistors are located roughly on the same straight line in a row direction of the sub-pixels, and the oxide active layers of the threshold compensation transistors are located roughly on the same straight line in the row direction of the sub-pixels.

Optionally, in the embodiments of the present disclosure, in the same row of sub-pixels, the centers of the second channel areas of the oxide active layers of the initialization transistors are located roughly on the same straight line in the row direction of the sub-pixels, and the centers of the second channel areas of the oxide active layers of the threshold compensation transistors are located roughly on the same straight line in the row direction of the sub-pixels.

Optionally, in the embodiments of the present disclosure, in the same column of sub-pixels, the oxide active layer of the initialization transistor and the oxide active layer of the threshold compensation transistor extend roughly on the same straight line in the column direction of the sub-pixels.

Optionally, in the embodiments of the present disclosure, the plurality of scanning wires include a plurality of first scanning wires and a plurality of second scanning wires, which are arranged at intervals, where one row of sub-pixels includes the first scanning wire and the second scanning wire; in the same sub-pixel, an orthographic projection of the first scanning wire on the base substrate and an orthographic projection of the second channel area of the oxide active layer of the initialization transistor on the base substrate have a first overlapping area, and a part, located in the first overlapping area, of the first scanning wire serves as a gate of the initialization transistor; and in the same sub-pixel, an orthographic projection of the second scanning wire on the base substrate and an orthographic projection of the second channel area of the oxide active layer of the threshold compensation transistor on the base substrate have a second overlapping area, and a part, located in the second overlapping area, of the second scanning wire serves as a gate of the threshold compensation transistor.

Optionally, in the embodiments of the present disclosure, the pixel circuit further includes a data writing transistor, and the silicon semiconductor layer further includes a silicon active layer of the data writing transistor; and the data wire is electrically connected to a first electrode area of the silicon active layer of the data writing transistor through a first via hole, and the first via hole penetrates through the first insulating layer, the second insulating layer, the third insulating layer and the fourth insulating layer.

Optionally, in the embodiments of the present disclosure, in the same sub-pixel, an orthographic projection of the second channel area of the oxide active layer of the threshold compensation transistor in the column direction is overlapped with an orthographic projection of the first via hole in the column direction.

Optionally, in the embodiments of the present disclosure, the plurality of scanning wires include a plurality of third scanning wires arranged at intervals, where one row of sub-pixels includes the third scanning wire; and in the same sub-pixel, an orthographic projection of the third scanning wire on the base substrate and an orthographic projection of a first channel area of the silicon active layer of the data writing transistor on the base substrate have a third overlapping area, and a part, located in the third overlapping area, of the third scanning wire serves as a gate of the data writing transistor.

Optionally, in the embodiments of the present disclosure, in the same sub-pixel, the orthographic projection of the second scanning wire on the base substrate is located between the orthographic projection of the first scanning wire on the base substrate and the orthographic projection of the third scanning wire on the base substrate.

Optionally, in the embodiments of the present disclosure, in the same sub-pixel, the orthographic projection of the third scanning wire on the base substrate is overlapped with an orthographic projection of the third electrode area of the oxide active layer of the threshold compensation transistor on the base substrate.

Optionally, in the embodiments of the present disclosure, the second conductive layer further includes a plurality of first auxiliary scanning wires arranged at intervals, where one row of the sub-pixels includes the first auxiliary scanning wire; in the same sub-pixel, an orthographic projection of the first auxiliary scanning wire on the base substrate and the orthographic projection of the second channel area of the oxide active layer of the initialization transistor on the base substrate have a fourth overlapping area; and the initialization transistor is a double-gate transistor, where a part, located in the first overlapping area, of the first scanning wire is a first gate of the initialization transistor, and a part, located in the fourth overlapping area, of the first auxiliary scanning wire is a second gate of the initialization transistor.

Optionally, in the embodiments of the present disclosure, in the same row, the orthographic projection of the first scanning wire on the base substrate covers the orthographic projection of the first auxiliary scanning wire on the base substrate.

Optionally, in the embodiments of the present disclosure, the second conductive layer further includes a plurality of second auxiliary scanning wires arranged at intervals, where one row of the sub-pixels includes the second auxiliary scanning wire; in the same sub-pixel, an orthographic projection of the second auxiliary scanning wire on the base substrate and the orthographic projection of the second channel area of the oxide active layer of the threshold compensation transistor on the base substrate have a fifth overlapping area; and the threshold compensation transistor is a double-gate transistor, where a part, located in the second overlapping area, of the second scanning wire is a first gate of the threshold compensation transistor, and a part, located in the fifth overlapping area, of the second auxiliary scanning wire is a second gate of the threshold compensation transistor.

Optionally, in the embodiments of the present disclosure, in the same row, the orthographic projection of the second scanning wire on the base substrate covers the orthographic projection of the second auxiliary scanning wire on the base substrate.

Optionally, in the embodiments of the present disclosure, the third conductive layer further includes a plurality of switching parts arranged at intervals, and the sub-pixels include the switching parts; the pixel circuit further includes a first light emitting control transistor and a second light emitting control transistor, and the silicon semiconductor layer further includes a silicon active layer of the first light emitting control transistor and a silicon active layer of the second light emitting control transistor; in the same sub-pixel, a second electrode area of the silicon active layer of the data writing transistor is electrically connected to a first electrode area of the silicon active layer of the first light emitting control transistor, and the power wire is electrically connected to a second electrode area of the silicon active layer of the first light emitting control transistor through a sixth via hole; and the second electrode area of the silicon active layer of the driving transistor is electrically connected to a first electrode area of the silicon active layer of the second light emitting control transistor, and a second electrode area of the silicon active layer of the second light emitting control transistor is electrically connected to the switching part through a seventh via hole, where the sixth via hole and the seventh via hole penetrate through the first insulating layer, the second insulating layer, the third insulating layer and the fourth insulating layer respectively.

Optionally, in the embodiments of the present disclosure, the first conductive layer further includes a plurality of light emitting control wires arranged at intervals, where one row of sub-pixels includes the light emitting control wire; in the same sub-pixel, an orthographic projection of the light emitting control wire on the base substrate is located on a side, facing away from the orthographic projection of the third scanning wire on the base substrate, of the orthographic projection of the gate of the driving transistor on the base substrate; in the same sub-pixel, the orthographic projection of the light emitting control wire on the base substrate and an orthographic projection of a first channel area of the silicon active layer of the first light emitting control transistor on the base substrate have a seventh overlapping area, and a part, located in the seventh overlapping area, of the light emitting control wire serves as a gate of the first light emitting control transistor; and in the same sub-pixel, the orthographic projection of the light emitting control wire on the base substrate and an orthographic projection of a first channel area of the silicon active layer of the second light emitting control transistor on the base substrate have an eighth overlapping area, and a part, located in the eighth overlapping area, of the light emitting control wire serves as a gate of the second light emitting control transistor.

Optionally, in the embodiments of the present disclosure, in the same sub-pixel, the orthographic projection of the auxiliary conductive part on the base substrate and an edge of the orthographic projection of the light emitting control wire on the base substrate have an overlapping area; and the orthographic projection of the storage conductive part on the base substrate does not overlap with the orthographic projection of the light emitting control wire on the base substrate.

Optionally, in the embodiments of the present disclosure, the fourth conductive layer further includes a plurality of initialization wires arranged at intervals, where one row of sub-pixels includes the initialization wire, and in the same sub-pixel, a third electrode area of the oxide active layer of the initialization transistor is electrically connected to the initialization wire; and in the same sub-pixel, an orthographic projection of the initialization wire on the base substrate is located on a side, facing away from the orthographic projection of the second scanning wire on the base substrate, of the orthographic projection of the first scanning wire on the base substrate.

Optionally, in the embodiments of the present disclosure, the pixel circuit further includes a reset transistor, and the silicon semiconductor layer further includes a silicon active layer of the reset transistor; the first conductive layer further includes a plurality of fourth scanning wires arranged at intervals, where one row of sub-pixels corresponds to one of the fourth scanning wires; in the same sub-pixel, an orthographic projection of the fourth scanning wire on the base substrate is located on a side, facing away from the orthographic projection of the light emitting control wire on the base substrate, of orthographic projections of the seventh via hole and the sixth via hole on the base substrate; and in the same sub-pixel, the orthographic projection of the fourth scanning wire on the base substrate and an orthographic projection of a first channel area of the silicon active layer of the reset transistor on the base substrate have a ninth overlapping area, and a part, located in the ninth overlapping area, of the fourth scanning wire serves as a gate of the reset transistor.

A display device provided by embodiments of the present disclosure includes the above display panel.

DETAILED DESCRIPTION OF THE EMBODIMENTS

Figure 1:
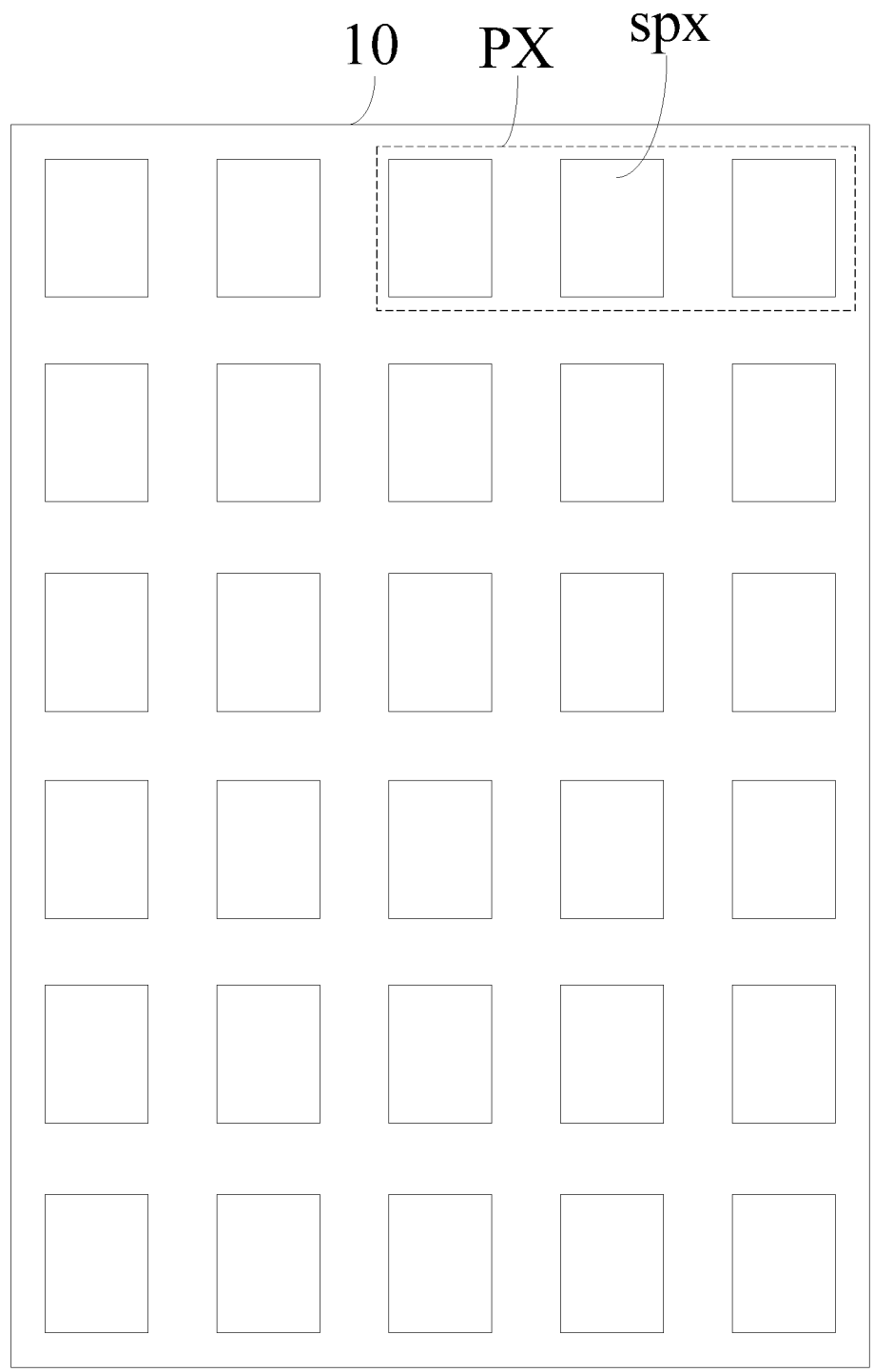
FIG. 1 is a structural schematic diagram of a display panel provided by embodiments of the present disclosure.

In order to make the purposes, technical solutions and advantages of the embodiments of the present disclosure clearer, the technical solutions of the embodiments of the present disclosure will be described clearly and completely with reference to the accompanying drawings of the embodiments of the present disclosure. Obviously, the described embodiments are only part of the embodiments of the present disclosure, not all of the embodiments. Besides, the embodiments in the present disclosure and the features in the embodiments may be combined with each other in the case of no confliction. Based on the embodiments described in the present disclosure, all other embodiments obtained by those of ordinary skill in the art without creative labor are within the scope of protection of the present disclosure.

Unless otherwise defined, technical terms or scientific terms used in the present disclosure shall have the ordinary meaning understood by those with ordinary skills in the field to which the present disclosure belongs. The words "first", "second" and the like used in the present disclosure do not indicate any order, quantity or importance, but are only used to distinguish different components. Words such as "comprise" or "include" mean that the elements or articles appearing before the words cover the elements or articles listed after the words and their equivalents, and do not exclude other elements or articles. Words such as "connect" are not limited to physical or mechanical connection, but may include electrical connection, whether direct or indirect.

It should be noted that the sizes and shapes of the figures in the accompanying drawings do not reflect true proportions, and are only for the purpose of schematically illustrating the present disclosure. The same or similar reference numerals refer to the same or similar elements or elements having the same or similar functions throughout.

Figure 2A:
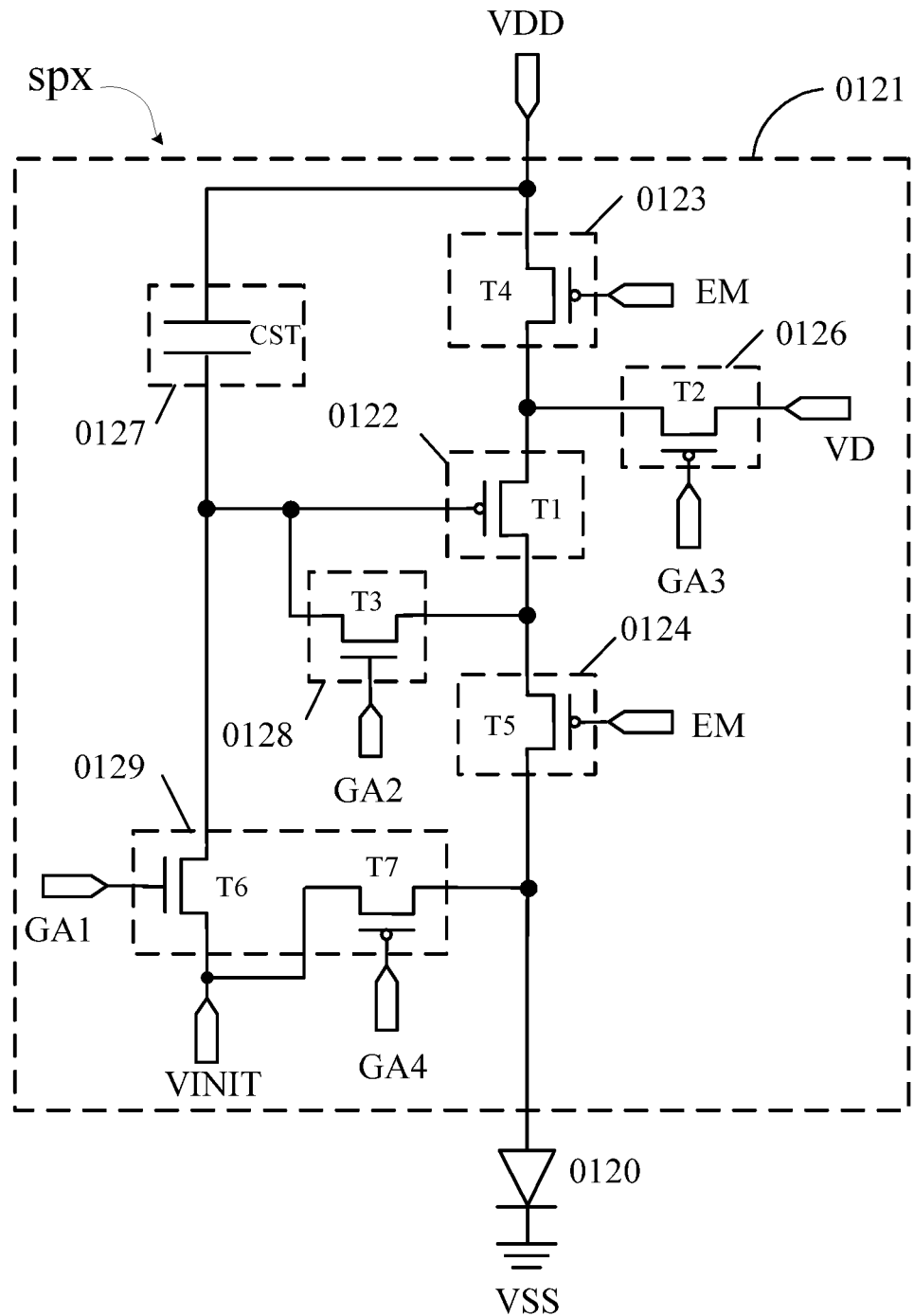
FIG. 2A is a structural schematic diagram of a pixel driving circuit provided by embodiments of the present disclosure.

As shown in FIG. 1, a display panel provided by embodiments of the present disclosure includes a base substrate 1000, and a plurality of pixel units PX located in a display area of the base substrate 1000. Each pixel unit PX includes a plurality of sub-pixels spx. Exemplarily, as shown in FIG. 1 and FIG. 2A, at least one of the plurality of sub-pixels spx includes a pixel driving circuit 0121 and a light emitting component 0120. The pixel driving circuit 0121 is provided with a transistor and a capacitor, and generates an electrical signal through the interaction between the transistor and the capacitor, and the generated electrical signal is input into a first electrode of the light emitting component 0120; and by applying a corresponding voltage to a second electrode of the light emitting component 0120, the light emitting component 0120 can be driven to emit light.

As shown in FIG. 2A, the pixel driving circuit 0121 includes a drive control circuit 0122, a first light emitting control circuit 0123, a second light emitting control circuit 0124, a data writing circuit 0126, a storage circuit 0127, a threshold compensation circuit 0128 and a reset circuit 0129.

The drive control circuit 0122 includes a control terminal, a first terminal and a second terminal. The drive control circuit 0122 is configured to provide a driving current for the light emitting component 0120 to drive the light emitting component 0120 to emit light. For example, the first light emitting control circuit 0123 is connected to the first terminal of the drive control circuit 0122 and a first voltage terminal VDD. The first light emitting control circuit 0123 is configured to enable or disable the connection between the drive control circuit 0122 and the first voltage terminal VDD.

The second light emitting control circuit 0124 is electrically connected to the second terminal of the drive control circuit 0122 and a first electrode of the light emitting component 0120. The second light emitting control circuit 0124 is configured to enable or disable the connection between the drive control circuit 0122 and the light emitting component 0120.

The data writing circuit 0126 is electrically connected to the first terminal of the drive control circuit 0122. The second light emitting control circuit 0124 is configured to write a signal on a data wire VD into the storage circuit 0127.

The storage circuit 0127 is electrically connected to the control terminal of the drive control circuit 0122 and the first voltage terminal VDD. The storage circuit 0127 is configured to store data signals.

The threshold compensation circuit 0128 is electrically connected to the control terminal and the second terminal of the drive control circuit 0122 respectively. The threshold compensation circuit 0128 is configured to perform threshold compensation on the drive control circuit 0122.

The reset circuit 0129 is electrically connected to the control terminal of the drive control circuit 0122 and the first electrode of the light emitting component 0120 respectively. The reset circuit 0129 is configured to reset the first electrode of the light emitting component 0120 and reset the control terminal of the drive control circuit 0122.

The light emitting component 0120 may be an electroluminescent diode, such as at least one of OLED and QLED. The light emitting component 0120 includes a first electrode, a light emitting functional layer, and a second electrode which are stacked. Exemplarily, the first electrode may be an anode and the second electrode may be a cathode. The light emitting functional layer includes a light emitting layer. Further, the light emitting functional layer may also include a hole injection layer, a hole transport layer, a light emitting layer, an electron transport layer, an electron injection layer and other film layers. Of course, in practical application, the light emitting component 0120 can be designed and determined according to the requirements of a practical application environment, which is not limited herein.

Exemplarily, as shown in FIG. 2A, the drive control circuit 0122 includes a driving transistor T1, the control terminal of the drive control circuit 0122 includes a gate of the driving transistor T1, the first terminal of the drive control circuit 0122 includes a first pole of the driving transistor T1, and the second terminal of the drive control circuit 0122 includes a second pole of the driving transistor T1.

Exemplarily, as shown in FIG. 2A, the data writing circuit 0126 includes a data writing transistor T2. The storage circuit 0127 includes a storage capacitor CST. The threshold compensation circuit 0128 includes a threshold compensation transistor T3. The first light emitting control circuit 0123 includes a first light emitting control transistor T4. The second light emitting control circuit 0124 includes a second light emitting control transistor T5. The reset circuit 0129 includes an initialization transistor T6 and a reset transistor T7.

Specifically, a first pole of the data writing transistor T2 is electrically connected to the first pole of the driving transistor T1, a second pole of the data writing transistor T2 is configured to be electrically connected to the data wire VD to receive a data signal, and a gate of the data writing transistor T2 is configured to be electrically connected to a third scanning wire GA3 to receive a signal.

A first pole of the storage capacitor CST is electrically connected to a first power supply terminal VDD, and a second pole of the storage capacitor CST is electrically connected to the gate of the driving transistor T1.

A first pole of the threshold compensation transistor T3 is electrically connected to the second pole of the driving transistor T1, a second pole of the threshold compensation transistor T3 is electrically connected to the gate of the driving transistor T1, and a gate of the threshold compensation transistor T3 is configured to be electrically connected to a second scanning wire GA2 to receive a signal.

A first pole of the initialization transistor T6 is configured to be electrically connected to an initialization wire VINIT to receive a reset signal, a second pole of the initialization transistor T6 is electrically connected to the gate of the driving transistor T1, and a gate of the initialization transistor T6 is configured to be electrically connected to a first scanning wire GA1 to receive a signal.

A first pole of the reset transistor T7 is configured to be electrically connected to the initialization wire VINIT to receive a reset signal, a second pole of the reset transistor T7 is electrically connected to the first electrode of the light emitting component 0120, and a gate of the reset transistor T7 is configured to be electrically connected to a fourth scanning line GA4 to receive a signal.

A first pole of the first light emitting control transistor T4 is electrically connected to the first power supply terminal VDD, a second pole of the first light emitting control transistor T4 is electrically connected to the first pole of the driving transistor T1, and a gate of the first light emitting control transistor T4 is configured to be electrically connected to a light emitting control wire EM to receive a light emitting control signal.

A first pole of the second light emitting control transistor T5 is electrically connected to the second pole of the driving transistor T1, a second pole of the second light emitting control transistor T5 is electrically connected to the first electrode of the light emitting component 0120, and a gate of the second light emitting control transistor T5 is configured to be electrically connected to the light emitting control wire EM to receive a light emitting control signal.

A second electrode of the light emitting component 0120 is electrically connected to a second power supply terminal VSS. The first poles and the second poles of the above transistors can be determined as sources or drains according to specific application, which is not limited herein.

Exemplarily, one of the first power supply terminal VDD and the second power supply terminal VSS is a high voltage terminal and the other is a low voltage terminal. For example, in an embodiment shown in FIG. 2A, the first power terminal VDD is a voltage source which outputs a constant first voltage, and the first voltage is a positive voltage; and the second power terminal VSS may be a voltage source which outputs a constant second voltage, and the second voltage is a negative voltage, etc. For example, in some examples, the second power supply terminal VSS may be grounded.

Figure 2B:
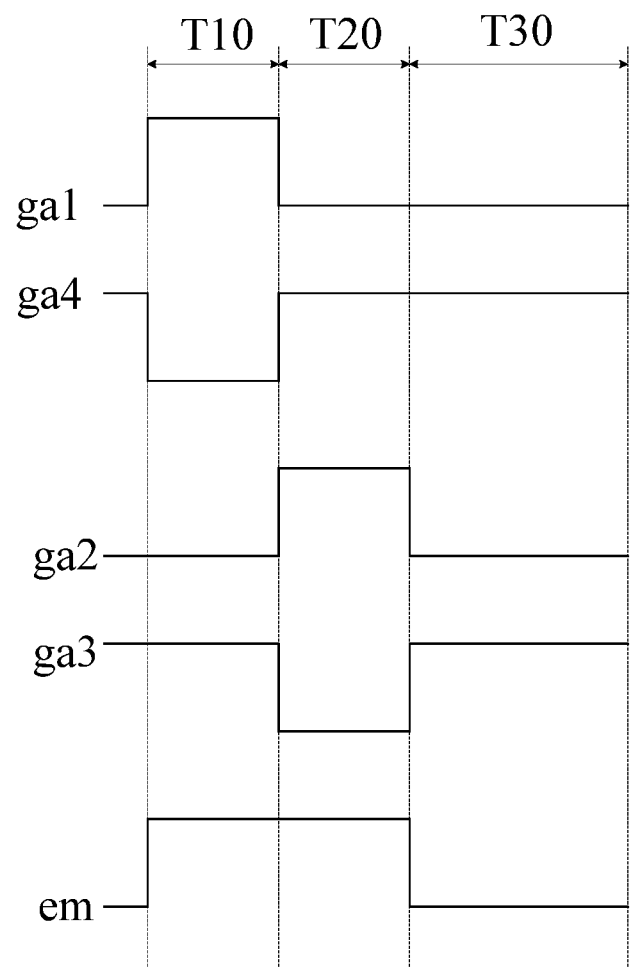
FIG. 2B is a signal timing diagram of a pixel driving circuit provided by embodiments of the present disclosure.

A signal timing diagram corresponding to a pixel driving circuit shown in FIG. 2A is as shown in FIG. 2B. In a frame of display time, the working process of the pixel driving circuit has three stages: stage T10, stage T20 and stage T30, where ga1 represents a signal transmitted on the first scanning wire GA1, ga2 represents a signal transmitted on the second scanning wire GA2, ga3 represents a signal transmitted on the third scanning wire GA3, ga4 represents a signal transmitted on the fourth scanning wire GA4, and em represents a signal transmitted on the light emitting control wire EM.

At stage T10, the signal ga1 controls the initialization transistor T6 to be turned on, so as to supply a signal transmitted on the initialization wire VINIT to the gate of the driving transistor T1 to reset the gate of the driving transistor T1. The signal ga4 controls the reset transistor T7 to be turned on, so as to supply the signal transmitted on the initialization wire VINIT to the first electrode of the light emitting component 0120 to reset the first electrode of the light emitting component 0120. At this stage, the signal ga3 controls the data writing transistor T2 to be turned off, the signal ga2 controls the threshold compensation transistor T3 to be turned off, and the signal em controls both the first light emitting control transistor T4 and the second light emitting control transistor T5 to be turned off.

At stage T20, the signal ga3 controls the data writing transistor T2 to be turned on, and the signal ga2 controls the threshold compensation transistor T3 to be turned on, so that the data signal transmitted on the data wire VD can charge the gate of the driving transistor T1, making the voltage of the gate of the driving transistor T1 become Vdata+Vth, where Vth represents a threshold voltage of the driving transistor T1 and Vdata represents a voltage of the data signal. At this stage, the signal ga1 controls the initialization transistor T6 to be turned off, the signal ga4 controls the reset transistor T7 to be turned off, and the signal em controls both the first light emitting control transistor T4 and the second light emitting control transistor T5 to be turned off.

At stage T30, the signal em controls both the first light emitting control transistor T4 and the second light emitting control transistor T5 to be turned on. The turned-on first light emitting control transistor T4 supplies a voltage Vdd of the first power supply terminal Vdd to the first pole of the driving transistor T1, so that the voltage of the first pole of the driving transistor T1 is Vdd. According to a gate voltage Vdata+|Vth| and the voltage Vdd of the first pole, the driving transistor T1 generates a driving current. This driving current is supplied to the light emitting component 0120 through the turned-on second light emitting control transistor T5 to drive the light emitting component 0120 to emit light. At this stage, the signal ga1 controls the initialization transistor T6 to be turned off, the signal ga4 controls the reset transistor T7 to be turned off, the signal ga3 controls the data writing transistor T2 to be turned off, and the signal ga2 controls the threshold compensation transistor T3 to be turned off.

It should be noted that, in the embodiments of the present disclosure, the pixel driving circuit in the sub-pixel may be of a structure including other numbers of transistors in addition to the structure as shown in FIG. 2A, which is not limited by the embodiment of the present disclosure.

Figure 3:
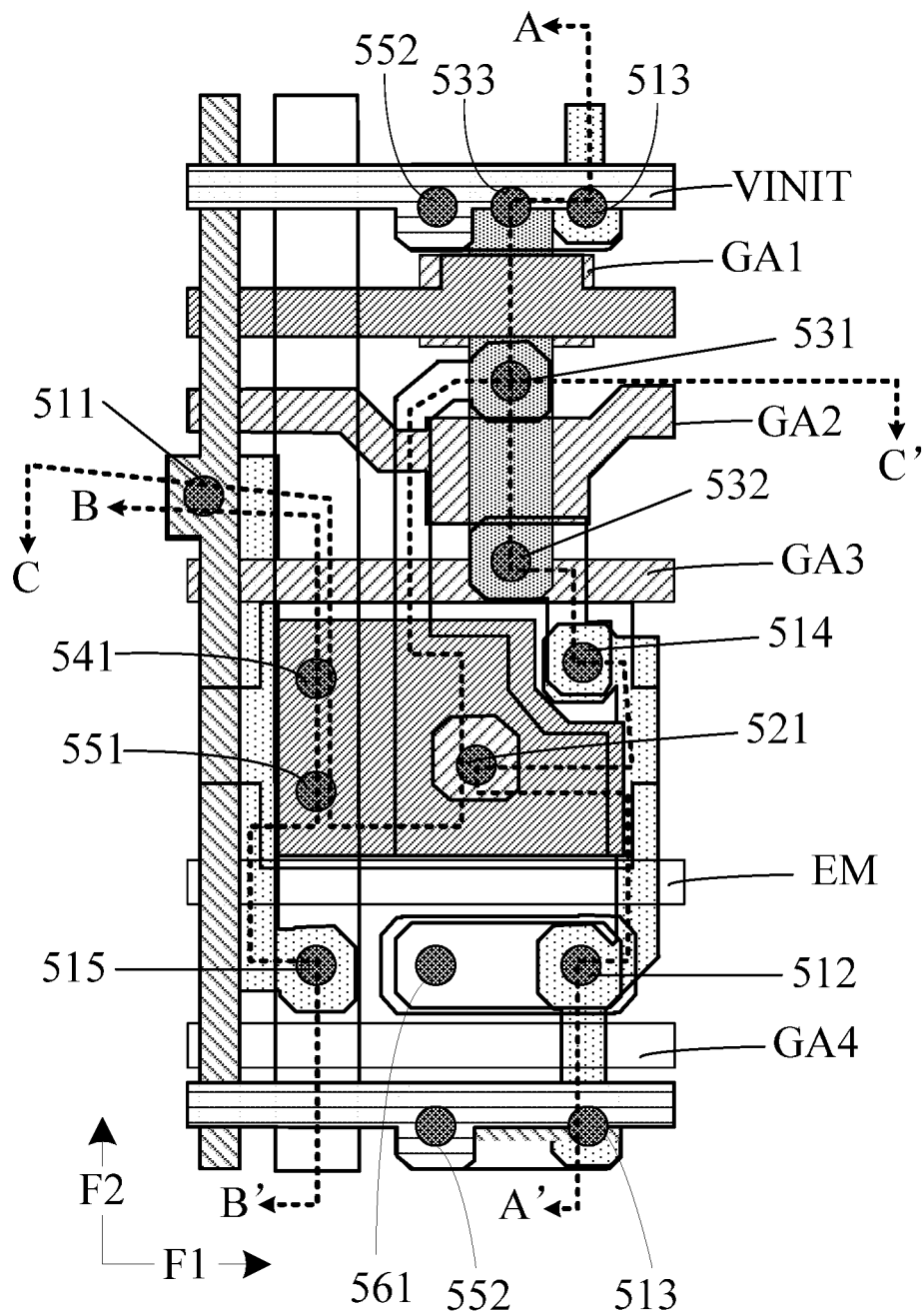
FIG. 3 is a structural schematic diagram of the layout of a pixel driving circuit provided by embodiments of the present disclosure.

FIG. 3 is a structural schematic diagram of the layout of a pixel driving circuit provided by some embodiments of the present disclosure. FIGS. 4A to 4F are schematic diagrams of each layer of a pixel driving circuit provided by some embodiments of the present disclosure. FIGS. 3 to 4F take the pixel driving circuit of one sub-pixel spx as an example. FIGS. 3 to 4F further show the first scanning wire GA1, the second scanning wire GA2, the third scanning wire GA3, the fourth scanning wire GA4, the initialization wire VINIT, the light emitting control wire EM, the data wire VD, and a power wire VDD, where the power wire VDD is configured to input a driving voltage (i.e., a first voltage) to the first power supply terminal VDD. Exemplarily, a plurality of data wires VD may be arranged roughly in a first direction F1.

Figure 4A:
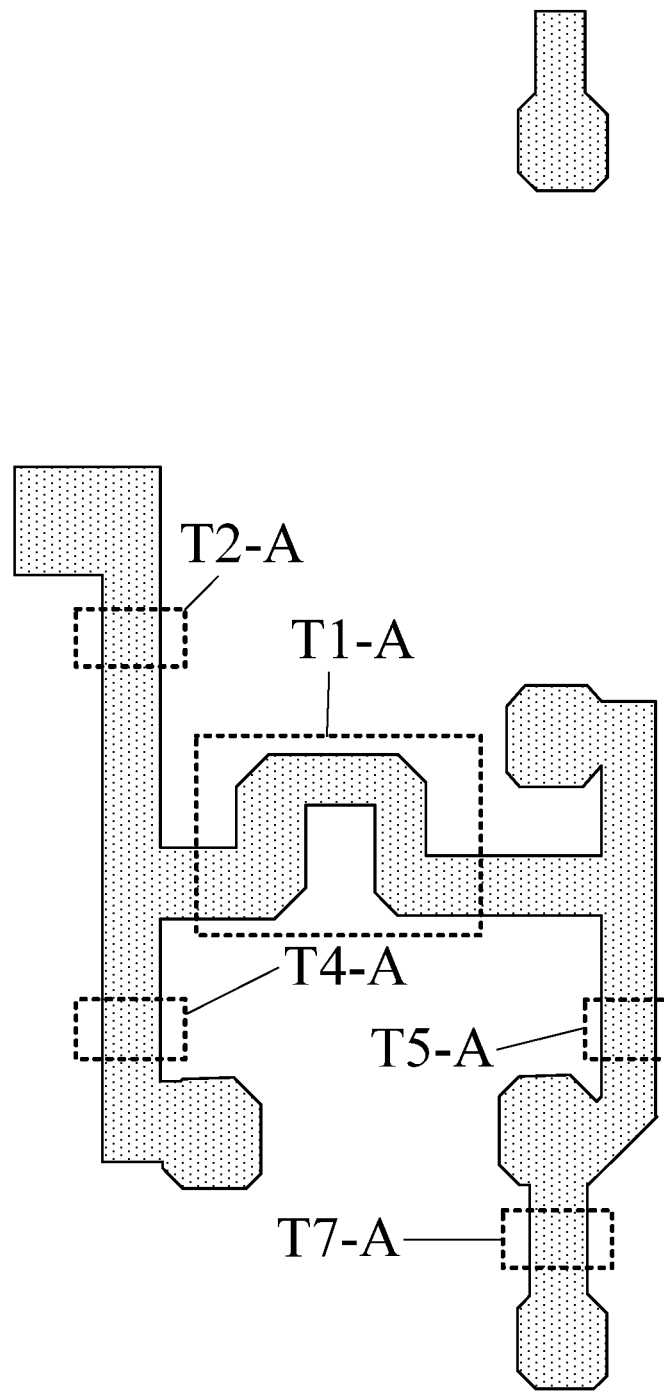
FIG. 4A is a schematic diagram of a silicon semiconductor layer provided by some embodiments of the present disclosure.

Exemplarily, FIGS. 3, 4A and 6A-7 show a silicon semiconductor layer 500 of the pixel driving circuit 0121. The silicon semiconductor layer 500 may be formed by patterning amorphous silicon and low temperature poly-silicon (LTPS) materials. The silicon semiconductor layer 500 can be used to fabricate silicon active layers of the above driving transistor T1, data writing transistor T2, first light emitting control transistor T4, second light emitting control transistor T5 and reset transistor T7. Furthermore, each silicon active layer may include a first electrode area, a second electrode area and a first channel area between the first electrode area and the second electrode area. For example, FIG. 4A schematically shows a first channel area T1-A of the driving transistor T1, a first channel area T2-A of the data writing transistor T2, a first channel area T4-A of the first light emitting control transistor T4, a first channel area T5-A of the second light emitting control transistor T5, and a first channel area T7-A of the reset transistor T7. It should be noted that the first electrode area and the second electrode area may be conductive areas formed by doping n-type impurities or p-type impurities in the silicon semiconductor layer 500. Therefore, the first electrode area and the second electrode area can be used as a source area and a drain area of the silicon active layer for electrical connection.

Exemplarily, as shown in FIGS. 6A-6D, a first insulating layer 710 is formed on the silicon semiconductor layer 500 for protecting the silicon semiconductor layer 500. As shown in FIGS. 3, 4B, 5A, and 6A-7, a first conductive layer 100 of the pixel driving circuit 0121 is shown. The first conductive layer 100 is arranged on a side, facing away from the base substrate 1000, of a first insulating layer 710, thereby being insulated from the silicon semiconductor layer 500. The first conductive layer 100 includes: a plurality of scanning wires arranged at intervals, a gate CC2a of the driving transistor, a plurality of light emitting control wires EM arranged at intervals, a gate T2-G of the data writing transistor T2, a first gate T3-G1 of the threshold compensation transistor T3, a gate T4-G of the first light emitting control transistor T4, a gate T5-G of the second light emitting control transistor T5, a first gate T6-G1 of the initialization transistor T6 and a gate T7-G of the reset transistor T7. Exemplarily, the plurality of scanning wires may include, for example, a plurality of first scanning wires GA1, a plurality of second scanning wires GA2, a plurality of third scanning wires GA3 and a plurality of fourth scanning wires GA4, which are arranged at intervals. Exemplarily, one row of sub-pixels corresponds to a first scanning wire GA1, a second scanning wire GA2, a third scanning wire GA3, a fourth scanning wire GA4 and a light emitting control line EM.

Exemplarily, as shown in FIGS. 3 to 7, in the same sub-pixel, an orthographic projection of the third scanning wire GA3 on the base substrate 1000 and an orthographic projection of the first channel area T2-A of the silicon active layer of the data writing transistor T2 on the base substrate 1000 have a third overlapping area, and a part, located in the third overlapping area, of the third scanning wire GA3 serves as the gate T2-G of the data writing transistor T2. That is, the gate T2-G of the data writing transistor T2 may be a part, overlapped with the silicon semiconductor layer 500, of the third scanning wire GA3.

Exemplarily, as shown in FIGS. 3 to 7, in the same sub-pixel, an orthographic projection of the light emitting control wire EM on the base substrate 1000 and an orthographic projection of the first channel area T4-A of the silicon active layer of the first light emitting control transistor T4 on the base substrate 1000 have a seventh overlapping area, and a part, located in the seventh overlapping area, of the light emitting control wire EM serves as the gate T4-G of the first light emitting control transistor T4. That is, the gate T4-G of the first light emitting control transistor T4 may be a first part, overlapped with the silicon semiconductor layer 500, of the light emitting control wire EM.

Exemplarily, as shown in FIGS. 3 to 7, in the same sub-pixel, the orthographic projection of the light emitting control wire EM on the base substrate 1000 and the first channel area T5-A of the silicon active layer of the second light emitting control transistor T5 have an eighth overlapping area, and a part, located in the eighth overlapping area, of the light emitting control wire EM serves as the gate T5-G of the second light emitting control transistor T5. That is, the gate T5-G of the second light emitting control transistor T5 may be a second part, overlapped with the silicon semiconductor layer 500, of the light emitting control wire EM.

Exemplarily, as shown in FIGS. 3 to 7, in the same sub-pixel, an orthographic projection of the fourth scanning wire GA4 on the base substrate 1000 and an orthographic projection of the first channel area T7-A of the silicon active layer of the reset transistor T7 on the base substrate 1000 have a ninth overlapping area, and a part, located in the ninth overlapping area, of the fourth scanning wire GA4 serves as the gate T7-G of the reset transistor T7.

Exemplarily, as shown in FIGS. 3 to 7, a second pole CC2a of the storage capacitor CST may be set as the gate CC2a of the driving transistor T1. That is to say, the gate CC2a of the driving transistor T1 and the second pole CC2a of the storage capacitor CST are of an integral structure.

Exemplarily, as shown in FIGS. 3, 4B, 5A and 7, the first scanning wire GA1, the second scanning wire GA2, the third scanning wire GA3, the light emitting control wire EM and the fourth scanning wire GA4 extend in the first direction F1. In addition, the first scanning wire GA1, the second scanning wire GA2, the third scanning wire GA3, the light emitting control wire EM, and the fourth scanning wire GA4 are arranged roughly in a second direction F2.

Exemplarily, as shown in FIGS. 3 to 7, in the same sub-pixel, an orthographic projection of the second scanning wire GA2 on the base substrate 1000 is located between an orthographic projection of the first scanning wire GA1 on the base substrate 1000 and the orthographic projection of the third scanning wire GA3 on the base substrate 1000. The orthographic projection of the third scanning wire GA3 on the base substrate 1000 is located between the orthographic projection of the second scanning wire GA2 on the base substrate 1000 and the orthographic projection of the light emitting control wire EM on the base substrate 1000. The orthographic projection of the fourth scanning wire GA4 on the base substrate 1000 is located on a side, facing away from the orthographic projection of the third scanning wire GA3 on the base substrate 1000, of the orthographic projection of the light emitting control wire EM on the base substrate 1000.

Exemplarily, as shown in FIGS. 3, 4B, 5A and 7, in the same sub-pixel, the orthographic projection of the light emitting control wire EM on the base substrate 1000 is located on a side, facing away from the orthographic projection of the second scanning wire GA2 on the base substrate 1000, of the orthographic projection of the third scanning wire GA3 on the base substrate 1000, and the orthographic projection of the fourth scanning wire GA4 on the base substrate 1000 is located on a side, facing away from the orthographic projection of the second scanning wire GA2 on the base substrate 1000, of the orthographic projection of the light emitting control wire EM on the base substrate 1000. In addition, in the second direction F2, an orthographic projection of the gate CC2*a* of the driving transistor T1 on the base substrate 1000 is located between the orthographic projection of the third scanning wire GA3 on the base substrate 1000 and the orthographic projection of the light emitting control wire EM on the base substrate 1000. That is, in the same sub-pixel, the orthographic projection of the light emitting control wire EM on the base substrate 1000 is located on a side, facing away from the orthographic projection of the third scanning wire GA3 on the base substrate 1000, of the orthographic projection of the gate CC2*a* of the driving transistor on the base substrate 1000.

Figure 4B:
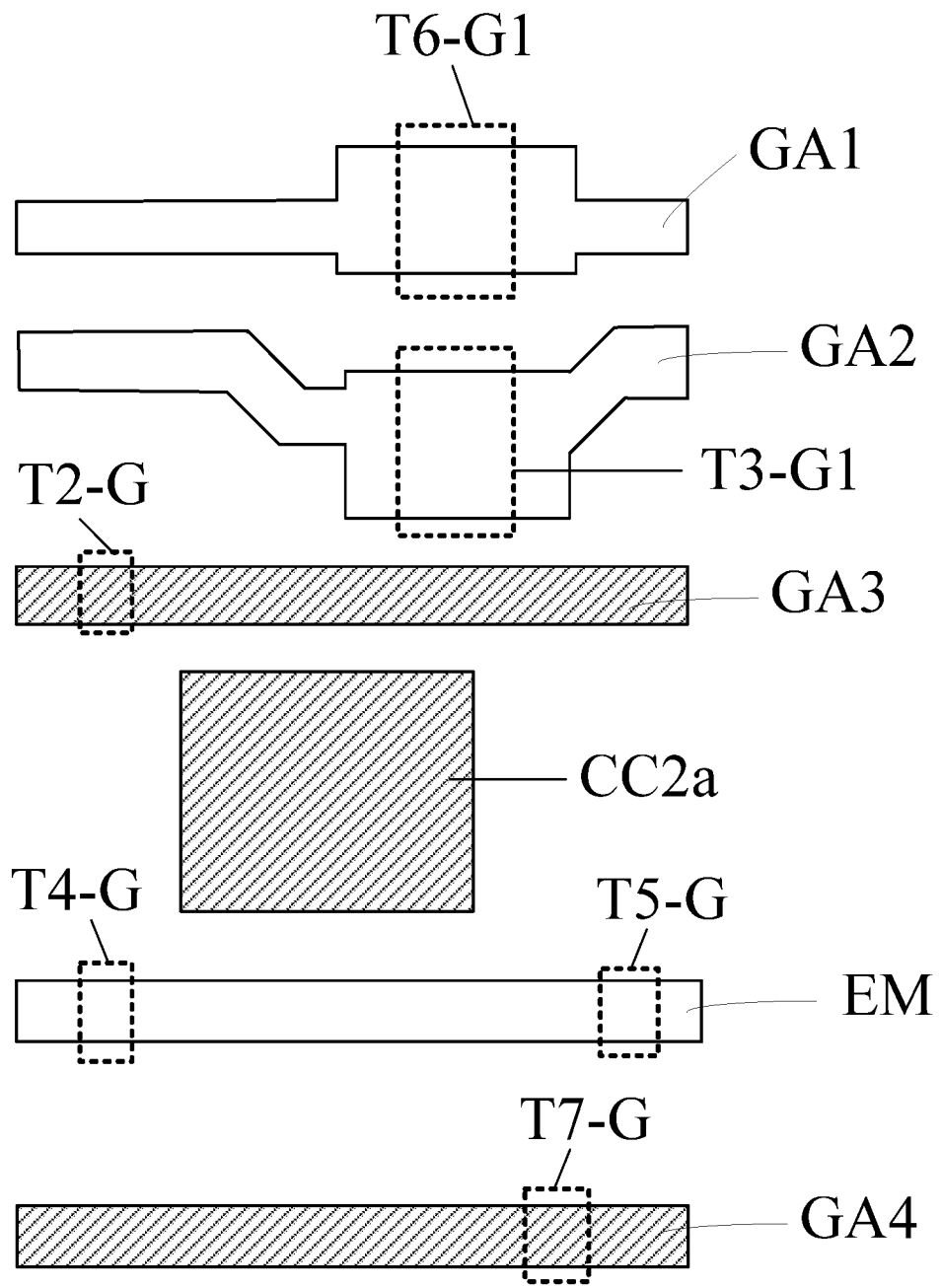
FIG. 4B is a schematic diagram of a first conductive layer provided by some embodiments of the present disclosure.

In some embodiments, as shown in FIGS. 3 and 4B, in the first direction F1, the gate T2-G of the data writing transistor T2 and the gate T4-G of the first light emitting control transistor T4 are both located on a third side of the gate CC2*a* of the driving transistor T1, and the gate T5-G of the second light emitting control transistor T5 and the gate T7-G of the reset transistor T7 are both located on a fourth side of the gate CC2*a* of the driving transistor T1. The third side and the fourth side of the gate CC2*a* of the driving transistor T1 are two opposite sides of the gate CC2*a* of the driving transistor T1 in the first direction F1.

Exemplarily, as shown in FIGS. 6A to 6D, a second insulating layer 720 is formed on the first conductive layer 100 for protecting the first conductive layer 100. As shown in FIGS. 3, 4C, 5B, and 6A to 7, an oxide semiconductor layer 600 of the pixel driving circuit 0121 is shown, and the oxide semiconductor layer 600 is located on a side, facing away from the base substrate 1000, of the second insulating layer 720. The oxide semiconductor layer 600 can be formed by patterning an oxide semiconductor material. Exemplarily, the oxide semiconductor material may be indium gallium zinc oxide (IGZO).

Figure 4C:
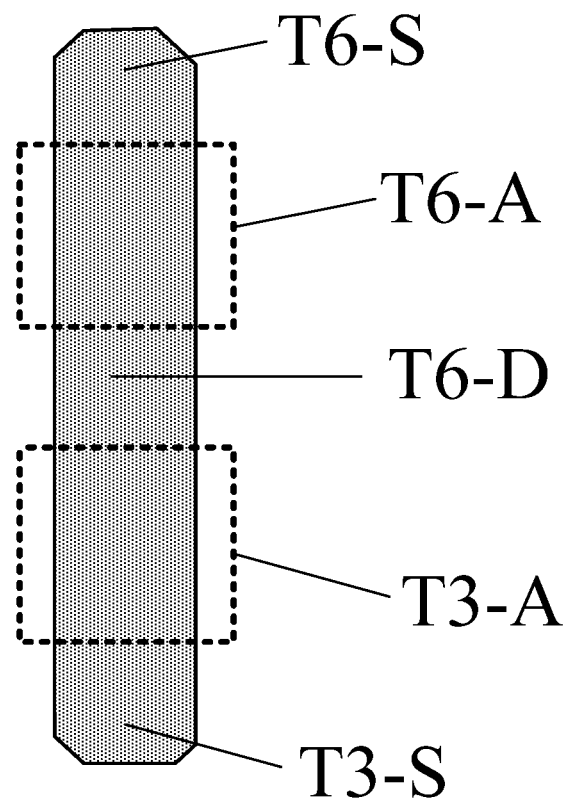
FIG. 4C is a schematic diagram of an oxide semiconductor layer provided by some embodiments of the present disclosure.
Figure 4D:
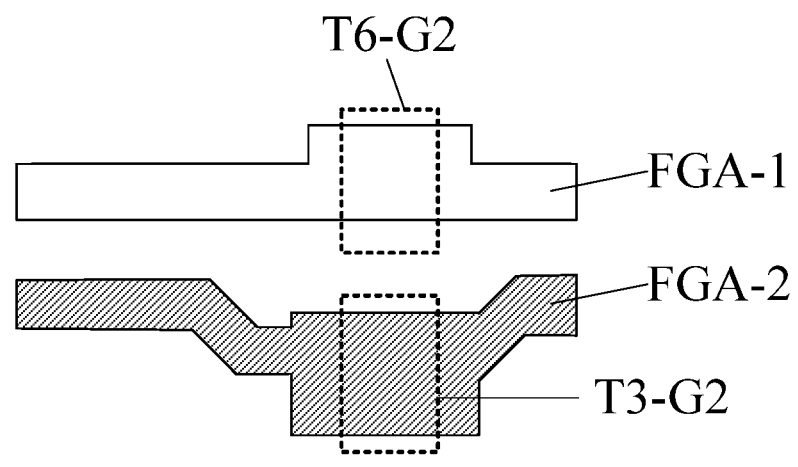
FIG. 4D is a schematic diagram of a second conductive layer provided by some embodiments of the present disclosure.
Figure 4D:
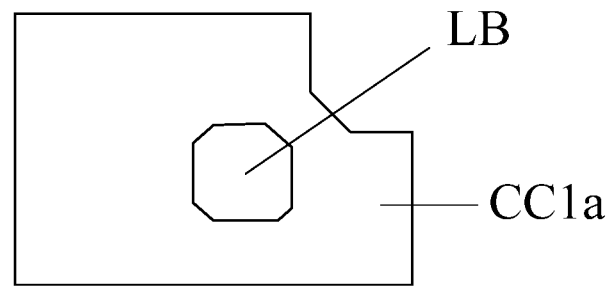

Exemplarily, as shown in FIGS. 3, 4C, 5B, 6A and 7, the oxide semiconductor layer 600 may include an oxide active layer of the initialization transistor T6 and an oxide active layer of the threshold compensation transistor T3, where the oxide active layer is provided with a third electrode area, a fourth electrode area and a second channel area located between the third electrode area and the fourth electrode area. For example, FIG. 4C schematically shows a second channel area T6-A of the oxide active layer of the initialization transistor T6 and a second channel area T3-A of the oxide active layer of the threshold compensation transistor T3. It should be noted that the third electrode area and the fourth electrode area described above may be conductive areas formed by doping n-type impurities or p-type impurities in the oxide semiconductor layer 600. Therefore, the third electrode area and the fourth electrode area can be used as a source area and a drain area of the oxide active layer for electrical connection.

Exemplarily, as shown in FIGS. 3, 4C, 6A and 7, in each sub-pixel, a third electrode area T6-S of the oxide active layer of the initialization transistor T6 is electrically connected to the initialization wire VINIT, a fourth electrode area T6-D of the oxide active layer of the initialization transistor T6 and a fourth electrode area T3-D of the oxide active layer of the threshold compensation transistor T3 are both electrically connected to the gate CC2*a* of the driving transistor T1, and a third electrode area T3-S of the oxide active layer of the threshold compensation transistor T3 is electrically connected to a second electrode area T1-D of the silicon active layer of the driving transistor T1. In this way, a reset signal loaded on the initialization wire VINIT can be transmitted to the gate of the driving transistor T1 through the oxide active layer of the initialization transistor T6 to reset the gate of the driving transistor T1, and the gate of the driving transistor T1 can be charged through the oxide active layer of the threshold compensation transistor T3, thereby realizing threshold compensation.

Since the leakage current of a transistor with an active layer made of a metal oxide semiconductor material is small, the off-state current of the initialization transistor T6 and the threshold compensation transistor T3 is small or even negligible, thereby reducing the influence of the leakage current on the gate voltage of the driving transistor and improving the stability of the gate voltage of the driving transistor.

Exemplarily, as shown in FIGS. 3, 4C, 6A and 7, in at least one of the plurality of sub-pixels, the fourth electrode area T6-D of the oxide active layer of the initialization transistor T6 is shared with the fourth electrode area of the oxide active layer of the threshold compensation transistor T3, and the oxide active layer of the initialization transistor T6 and the oxide active layer of the threshold compensation transistor T3 extend roughly on the same straight line in a column direction of the sub-pixel. Exemplarily, in each sub-pixel, the fourth electrode area T6-D of the oxide active layer of the initialization transistor T6 is shared with the fourth electrode area of the oxide active layer of the threshold compensation transistor T3, and the oxide active layer of the initialization transistor T6 and the oxide active layer of the threshold compensation transistor T3 extend roughly on the same straight line in the column direction of the sub-pixel, i.e., extend in the column direction of the sub-pixel, that is, parallel to the column direction F2.

It should be noted that the expression that in the same sub-pixel, the fourth electrode areas T6-D of the oxide active layer of the initialization transistor T6 is shared with the fourth electrode area of the oxide active layer of the threshold compensation transistor T3 may mean that the oxide active layer of the initialization transistor T6 and the oxide active layer of the threshold compensation transistor T3 are of an integral structure, or the oxide active layer of the initialization transistor T6 and the oxide active layer of the threshold compensation transistor T3 are connected to the same conductive layer.

If the oxide active layer of the initialization transistor T6 and the oxide active layer of the threshold compensation transistor T3 are set to be non-linear, there will be corners on the oxide active layer of the initialization transistor T6 and the oxide active layer of the threshold compensation transistor T3. When the non-linear oxide active layer of the initialization transistor T6 and the non-linear oxide active layer of the threshold compensation transistor T3 are prepared, due to the limitation of exposure accuracy, there are etching residues at the corners result in characteristic reduction of the initialization transistor T6 and the threshold compensation transistor T3, which further leads to a decrease in the voltage stability of the gate of the driving transistor, and then leads to a decrease in the display effect.

In the embodiments of the present disclosure, the fourth electrode area of the oxide active layer of the initialization transistor is shared with the fourth electrode area of the oxide active layer of the threshold compensation transistor, and the oxide active layer of the initialization transistor and the oxide active layer of the threshold compensation transistor extend roughly on the same straight line in the column direction of the sub-pixel. In this way, the oxide active layer of the initialization transistor and the oxide active layer of the threshold compensation transistor which are integrated can have a simple shape and there are no corners. Therefore, the problem of characteristic reduction of the initialization transistor T6 and the threshold compensation transistor T3 due to the limitation of exposure accuracy can be avoided.

Exemplarily, as shown in FIGS. 3, 4C, and 6A to 7, in the same row of sub-pixels, the oxide active layers of the initialization transistors T6 are arranged roughly on the same straight line in the row direction F1 of the sub-pixels, and the oxide active layers of the threshold compensation transistors T3 are arranged roughly on the same straight line in the row direction F1 of the sub-pixels. In some embodiments, in the same row of sub-pixels, the centers of the second channel areas T6-A of the oxide active layers of the initialization transistors T6 are located roughly on the same straight line in the row direction F1 of the sub-pixels, and the centers of the second channel areas T3-A of the oxide active layers of the threshold compensation transistors T3 are located roughly on the same straight line in the row direction F1 of the sub-pixels.

Exemplarily, as shown in FIGS. 3, 4C, and 6A to 7, in the same column of sub-pixels, the oxide active layers of the initialization transistors T6 and the oxide active layers of the threshold compensation transistors T3 extend roughly on the same straight line in the column direction F2 of the sub-pixels. In some examples, in the same column of sub-pixels, the centers of the second channel areas T6-A of the oxide active layers of the initialization transistors T6 and the centers of the second channel areas T3-A of the oxide active layers of the threshold compensation transistors T3 are located roughly on the same straight line in the column direction F2 of the sub-pixels.

Exemplarily, as shown in FIGS. 3, 4C, and 6A to 7, in the same sub-pixel, the orthographic projection of the third scanning wire GA3 on the base substrate 1000 is overlapped with an orthographic projection of the third electrode area T3-S of the oxide active layer of the threshold compensation transistor T3 on the base substrate 1000.

It should be noted that in the actual process, due to the limitation of process conditions or other factors, an extension direction of the oxide active layers and the column direction cannot be completely parallel, and certain deviation may exist. Therefore, it belongs to the protection scope of this disclosure as long as the extension direction of the oxide active layers and the column direction are roughly parallel. For example, the above parallel may be may be allowed within an allowable error range.

Exemplarily, as shown in FIGS. 3, 4C, 5B and 6A to 7, in the same sub-pixel, the orthographic projection of the first scanning wire GA1 on the base substrate 1000 and an orthographic projection of the second channel area T6-A of the oxide active layer of the initialization transistor T6 on the base substrate 1000 have a first overlapping area, and a part, located in the first overlapping area, of the first scanning wire GA1 serves as the gate of the initialization transistor T6. In addition, in the same sub-pixel, the orthographic projection of the second scanning wire GA2 on the base substrate 1000 and an orthographic projection of the second channel area T3-A of the oxide active layer of the threshold compensation transistor T3 on the base substrate 1000 have a second overlapping area, and a part, located in the second overlapping area, of the second scanning wire GA2 serves as the gate of the threshold compensation transistor T3.

Exemplarily, as shown in FIGS. 6A to 6D, a third insulating layer 730 located on a side, facing away from the base substrate 1000, of the oxide semiconductor layer 600 is formed on the oxide semiconductor layer 600 to protect the oxide semiconductor layer 600. As shown in FIGS. 3, 4D, 5C and 6A to 6D, a second conductive layer 200 of the pixel driving circuit 0121 is shown. The second conductive layer 200 is arranged on a side, facing away from the base substrate 1000, of the third insulating layer 730. The second conductive layer 200 may include a plurality of first auxiliary scanning wires FGA1, a plurality of second auxiliary scanning wires FGA2, and a plurality of storage conductive parts CC1a, which are arranged at intervals.

Exemplarily, as shown in FIGS. 3, 4D, 5C and 6A to 6D, a storage conductive part CC1a is arranged in each sub-pixel. In the same sub-pixel, an orthographic projection of the storage conductive part CCla on the base substrate 1000 and the orthographic projection of the gate CC2a of the driving transistor T1 on the base substrate 1000 have a sixth overlapping area, and the storage conductive part CC1a and the gate CC2a of the driving transistor T1 located in the sixth overlapping area form a storage capacitor CST. Further, the storage conductive part CC1a has a hollowed-out area LB. The orthographic projection of the gate CC2a of the driving transistor T1 on the base substrate 1000 covers the hollowed-out area LB of the storage conductive part CC1a.

Exemplarily, as shown in FIGS. 3, 4D, 5C and 6A to 7, one row of sub-pixels corresponds to one first auxiliary scanning wire FGA1. In the same sub-pixel, an orthographic projection of the first auxiliary scanning wire FGA1 on the base substrate 1000 and the orthographic projection of the second channel area T6-A of the oxide active layer of the initialization transistor T6 on the base substrate 1000 have a fourth overlapping area. Furthermore, the initialization transistor T6 can be a double-gate transistor, a part, located in the first overlapping area, of the first scanning wire GA1 is the first gate T6-G1 of the initialization transistor T6, and a part, located in the fourth overlapping area, of the first auxiliary scanning wire FGA1 is a second gate T6-G2 of the initialization transistor T6. By enabling the initialization transistor T6 to be a double-gate transistor, the off-state current of the initialization transistor T6 can be further reduced, thereby reducing the influence of the leakage current on the gate voltage of the driving transistor and further improving the stability of the gate voltage of the driving transistor.

Exemplarily, as shown in FIGS. 3, 4D, 5C and 6A to 7, in the same row, the orthographic projection of the first scanning wire GA1 on the base substrate 1000 covers the orthographic projection of the first auxiliary scanning wire FGA1 on the base substrate 1000. Further, in the same row, the orthographic projection of the first scanning wire GA1 on the base substrate 1000 is overlapped with the orthographic projection of the first auxiliary scanning wire FGA1 on the base substrate 1000. In this way, the first auxiliary scanning wire FGA1 can be prevented from causing excessive interference to other signal wires.

Exemplarily, the signals loaded by the first scanning wire GA1 and the first auxiliary scanning wire FGA1 corresponding to the same initialization transistor T6 can be the same. Further, the first scanning wire GA1 and the first auxiliary scanning wire FGA1 corresponding to the same initialization transistor T6 may be electrically connected in a non-display area to transmit the same signal.

Exemplarily, as shown in FIGS. 3, 4D, 5C and 6A to 7, one row of sub-pixels corresponds to one second auxiliary scanning wire FGA2. In the same sub-pixel, an orthographic projection of the second auxiliary scanning wire FGA2 on the base substrate 1000 and the orthographic projection of the second channel area T3-A of the oxide active layer of the threshold compensation transistor T3 on the base substrate 1000 have a fifth overlapping area. Further, the threshold compensation transistor T3 can be a double-gate transistor, where a part, located in the second overlapping area, of the second scanning wire GA2 is the first gate T3-G1 of the threshold compensation transistor T3, and a part, located in the fifth overlapping area, of the second auxiliary scanning wire FGA2 is a second gate T3-G2 of the threshold compensation transistor T3. By enabling the threshold compensation transistor T3 to be a double-gate transistor, the off-state current of the threshold compensation transistor T3 can be further reduced, thereby reducing the influence of the leakage current on the gate voltage of the driving transistor and further improving the stability of the gate voltage of the driving transistor.

Exemplarily, as shown in FIGS. 3, 4D, 5C and 6A to 7, in the same row, the orthographic projection of the second scanning wire GA2 on the base substrate 1000 covers the orthographic projection of the second auxiliary scanning wire FGA2 on the base substrate 1000. Further, in the same row, the orthographic projection of the second scanning wire GA2 on the base substrate 1000 is overlapped with the orthographic projection of the second auxiliary scanning wire FGA2 on the base substrate 1000. In this way, the second auxiliary scanning wire FGA2 can be prevented from causing excessive interference to other signal wires.

Exemplarily, the signals loaded by the second scanning wire GA2 and the second auxiliary scanning wire FGA2 corresponding to the same threshold compensation transistor T3 can be the same. Further, the second scanning wire GA2 and the second auxiliary scanning wire FGA2 corresponding to the same threshold compensation transistor T6 can be electrically connected in the non-display area to transmit the same signal.

Exemplarily, as shown in FIGS. 6A to 6D, a fourth insulating layer 740 located on a side, facing away from the base substrate 1000, of the second conductive layer 200 is further included, i.e., is formed on the second conductive layer 200 to protect the second conductive layer 200. As shown in FIGS. 3, 4E, 5D, and 6A to 6D, a third conductive layer 300 of the pixel driving circuit 0121 is shown, and the third conductive layer 300 is arranged on a side, facing away from the base substrate 1000, of the fourth insulating layer 740. The third conductive layer 300 may include a plurality of data wires VD, a plurality of power wires Vdd, a plurality of first connecting parts 310, a plurality of second connecting parts 320, a plurality of third connecting parts 330 and a plurality of fourth connecting parts 340, which are arranged at intervals. The data wires VD, the power wires Vdd, the first connecting parts 310, the second connecting parts 320, the third connecting parts 330 and the fourth connecting parts 340 are arranged at intervals.

Exemplarily, as shown in FIGS. 3, 4E, 5D, and 6A to 6D, the data wires VD and the power wires Vdd are arranged in the row direction F1, and the data wires VD and the power wires Vdd extend in the column direction F2. One first connecting part 310, one second connecting part 320, one third connecting part 330 and one fourth connecting part 340 are arranged in one sub-pixel. Exemplarily, one column of sub-pixels corresponds to one power wire Vdd, and one column of sub-pixels corresponds to one data wire VD.

Exemplarily, as shown in FIGS. 3, 4E, 5D, and 6A to 6D, an orthographic projection of the first connecting part 310 on the base substrate 1000 covers an orthographic projection of the hollowed-out area LB on the base substrate 1000.

Figure 4E:
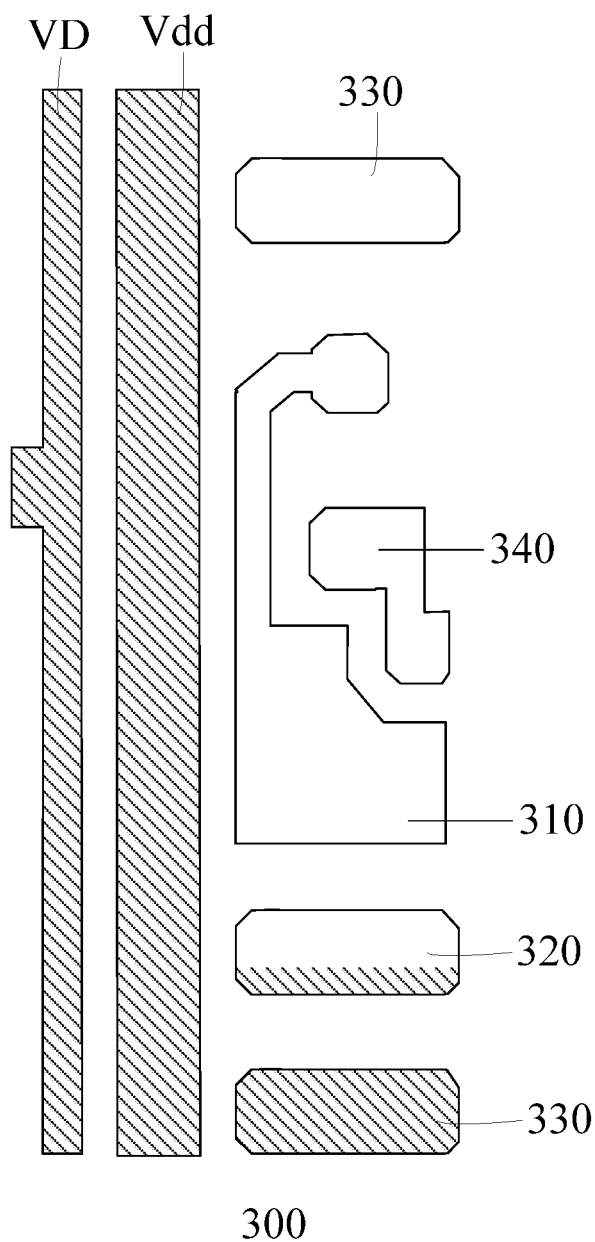
FIG. 4E is a schematic diagram of a third conductive layer provided by some embodiments of the present disclosure.
Figure 4F:
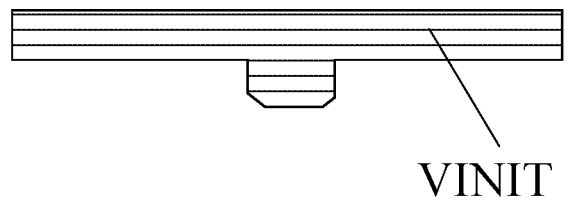
FIG. 4F is a schematic diagram of a fourth conductive layer provided by some embodiments of the present disclosure.
Figure 4F:
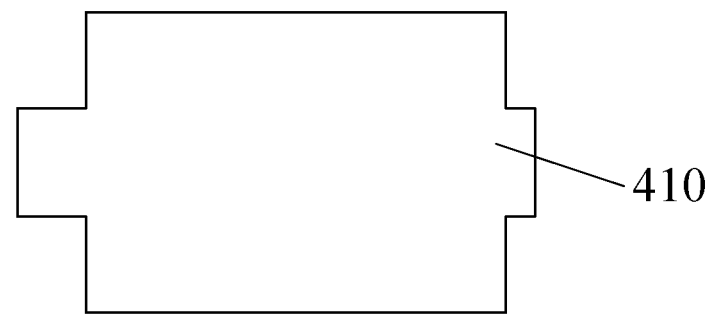
Figure 4F:
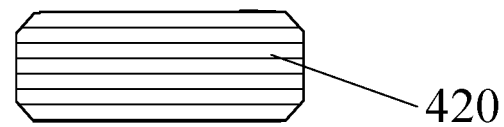
Figure 4F:
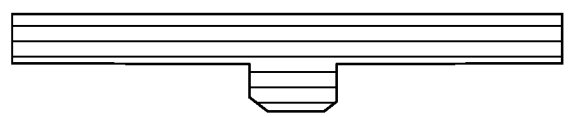
Figure 5A:
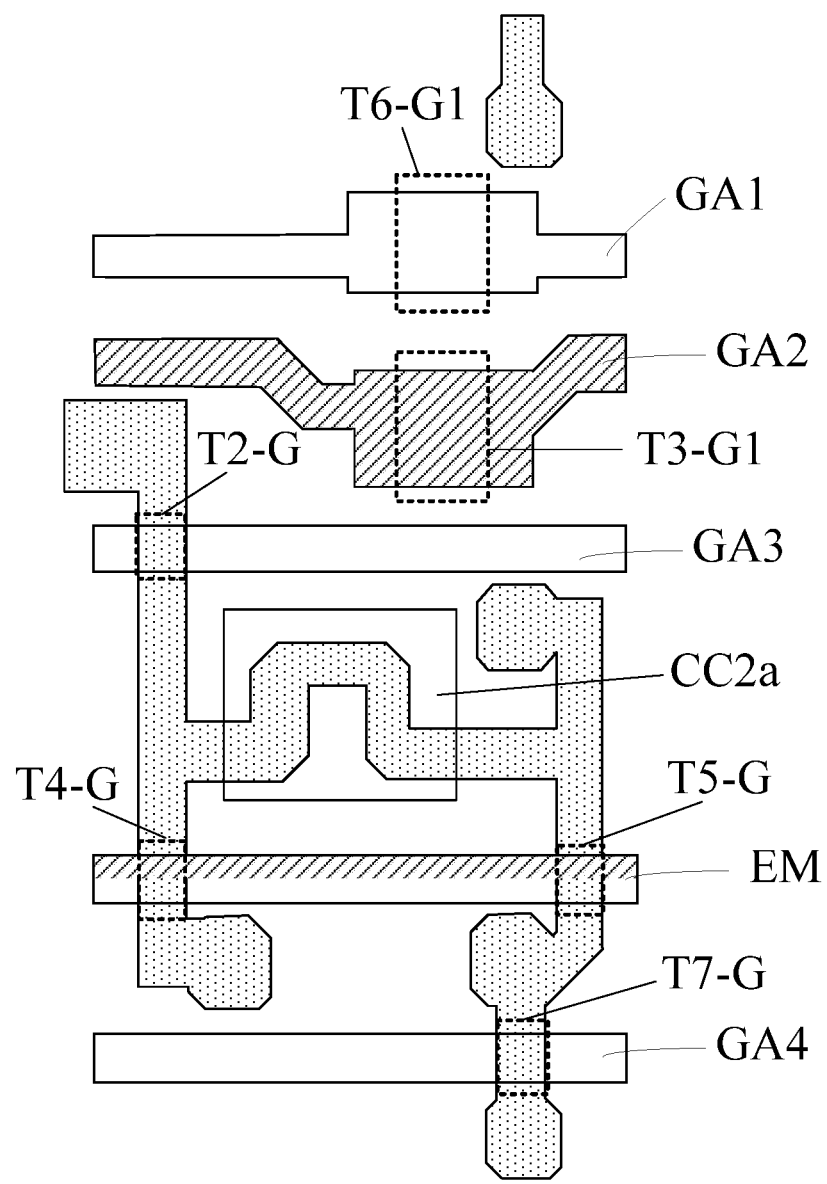
FIG. 5A is a schematic diagram of some other first conductive layers provided by some embodiments of the present disclosure.
Figure 5B:
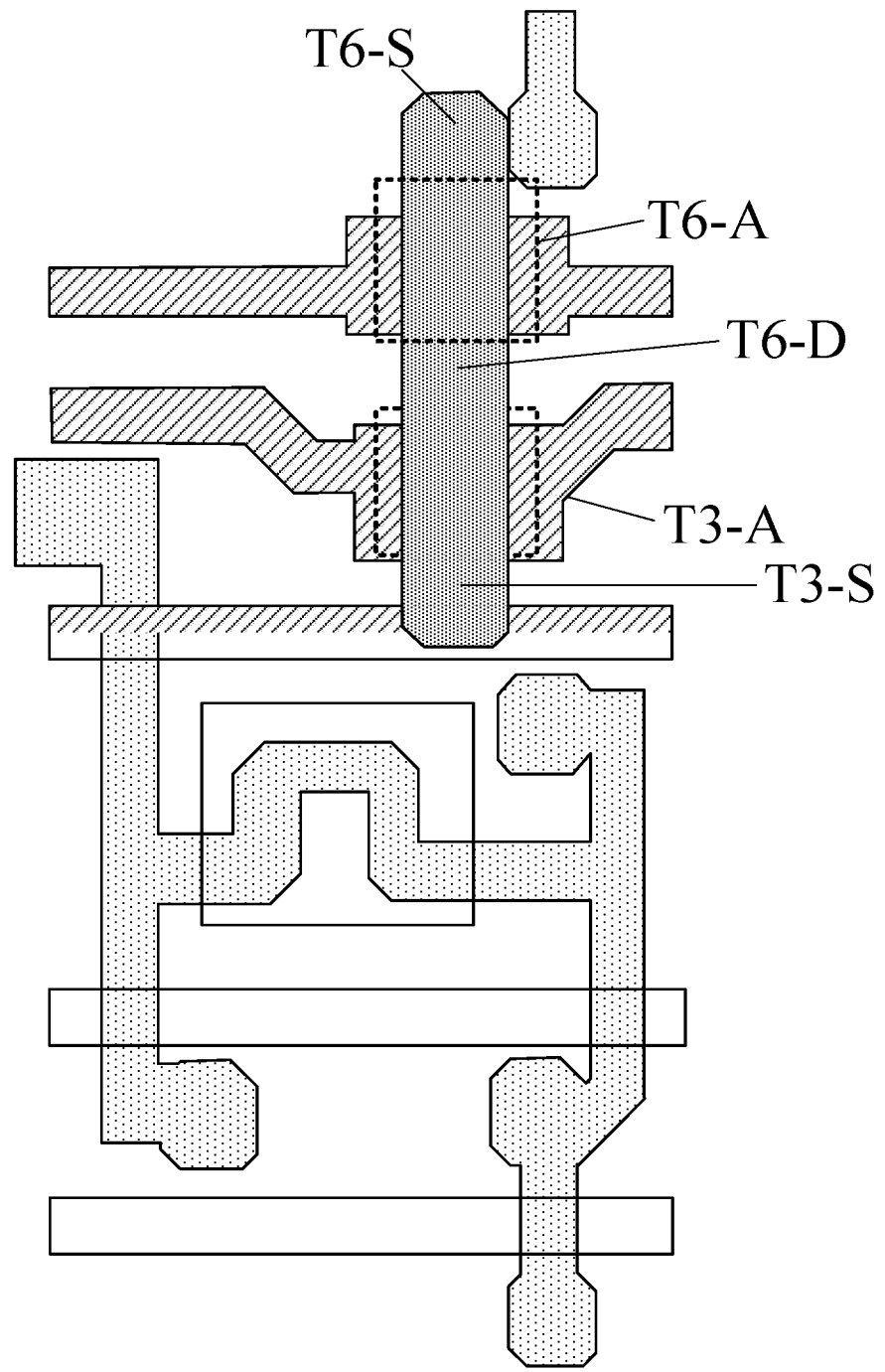
FIG. 5B is a schematic diagram of some other oxide semiconductor layers provided by some embodiments of the present disclosure.
Figure 5C:
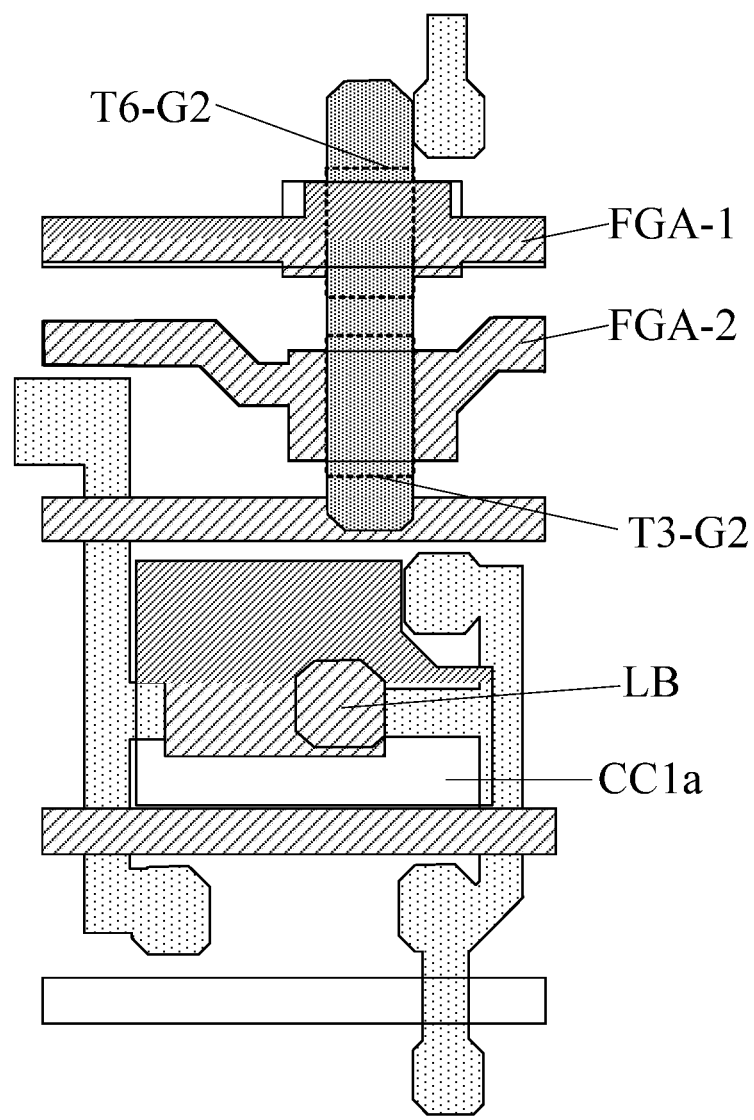
FIG. 5C is a schematic diagram of some other second conductive layers provided by some embodiments of the present disclosure.
Figure 5D:
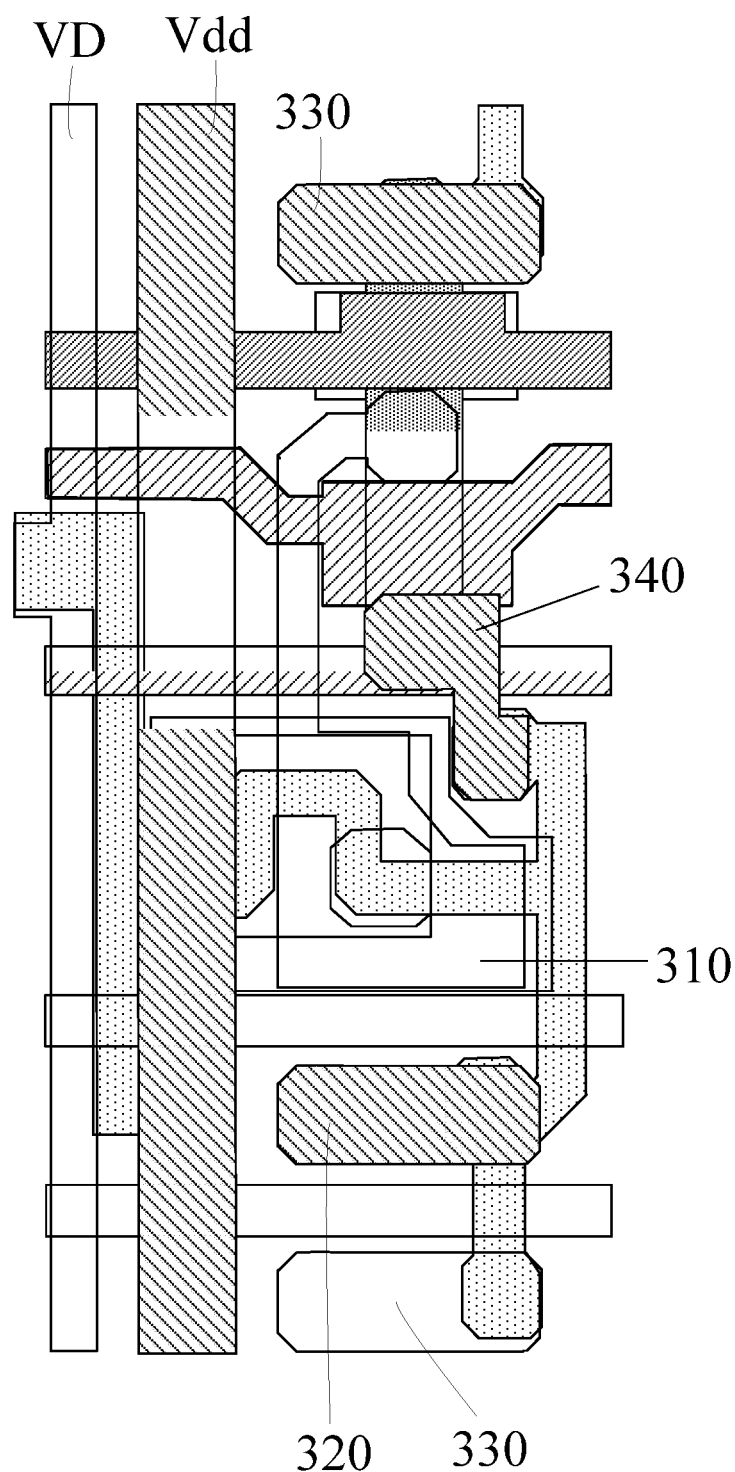
FIG. 5D is a schematic diagram of some other third conductive layers provided by some embodiments of the present disclosure.
Figure 5E:
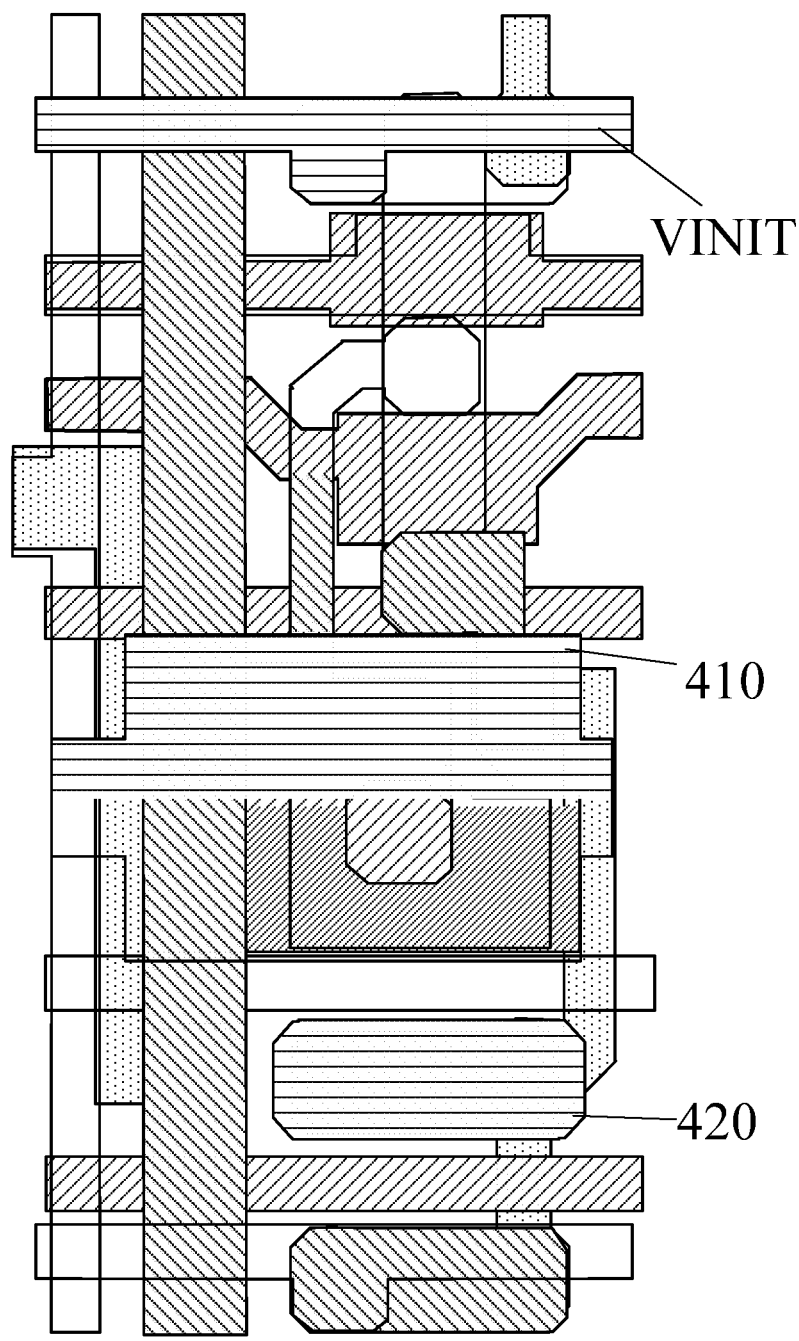
FIG. 5E is a schematic diagram of some other fourth conductive layers provided by some embodiments of the present disclosure.

Exemplarily, as shown in FIGS. 3 and 4E, in the same column, an orthographic projection of the power wire Vdd on the base substrate 1000 is located between an orthographic projection of the data wire VD on the base substrate 1000 and the orthographic projection of the first connecting part 310 on the base substrate 1000.

Exemplarily, as shown in FIGS. 6A to 6D, a fifth insulating layer 750 located on a side, facing away from the base substrate 1000, of the third conductive layer 300 is further included, i.e., is formed on the third conductive layer 300 to protect the third conductive layer 300. As shown in FIGS. 3, 4F, 5E, and 6A to 7, a fourth conductive layer 400 of the pixel driving circuit 0121 is shown, and the fourth conductive layer 400 is arranged on a side, facing away from the base substrate 1000, of the fifth insulating layer 750. The fourth conductive layer 400 may include a plurality of initialization wires VINIT arranged at intervals, a plurality of auxiliary conductive parts 410 arranged at intervals, and a plurality of switching parts 420. The initialization wires VINIT, the auxiliary conductive parts 410, and the switching parts 420 are arranged at intervals. One sub-pixel is provided with one auxiliary conductive part 410 and one switching part 420. One row of sub-pixels corresponds to one initialization wire VINIT. Exemplarily, in the same sub-pixel, the orthographic projection of the initialization wire VINIT on the base substrate 1000 is located on a side, facing away from the orthographic projection of the second scanning wire GA2 on the base substrate 1000, of the orthographic projection of the first scanning wire GA1 on the base substrate 1000.

Exemplarily, as shown in FIGS. 3, 4F, 5E, and 6A to 7, an orthographic projection of the auxiliary conductive part 410 on the base substrate 1000 is overlapped with the orthographic projection of the first connecting part 310 on the base substrate 1000. Further, in the same sub-pixel, the orthographic projection of the auxiliary conductive part 410 on the base substrate 1000 covers the orthographic projection of the storage conductive part CC1a on the base substrate 1000. Further, in the same sub-pixel, the orthographic projection of the auxiliary conductive part 410 on the base substrate 1000 and an edge of the orthographic projection of the light emitting control wire EM on the base substrate 1000 have an overlapping area.

Figure 6A:
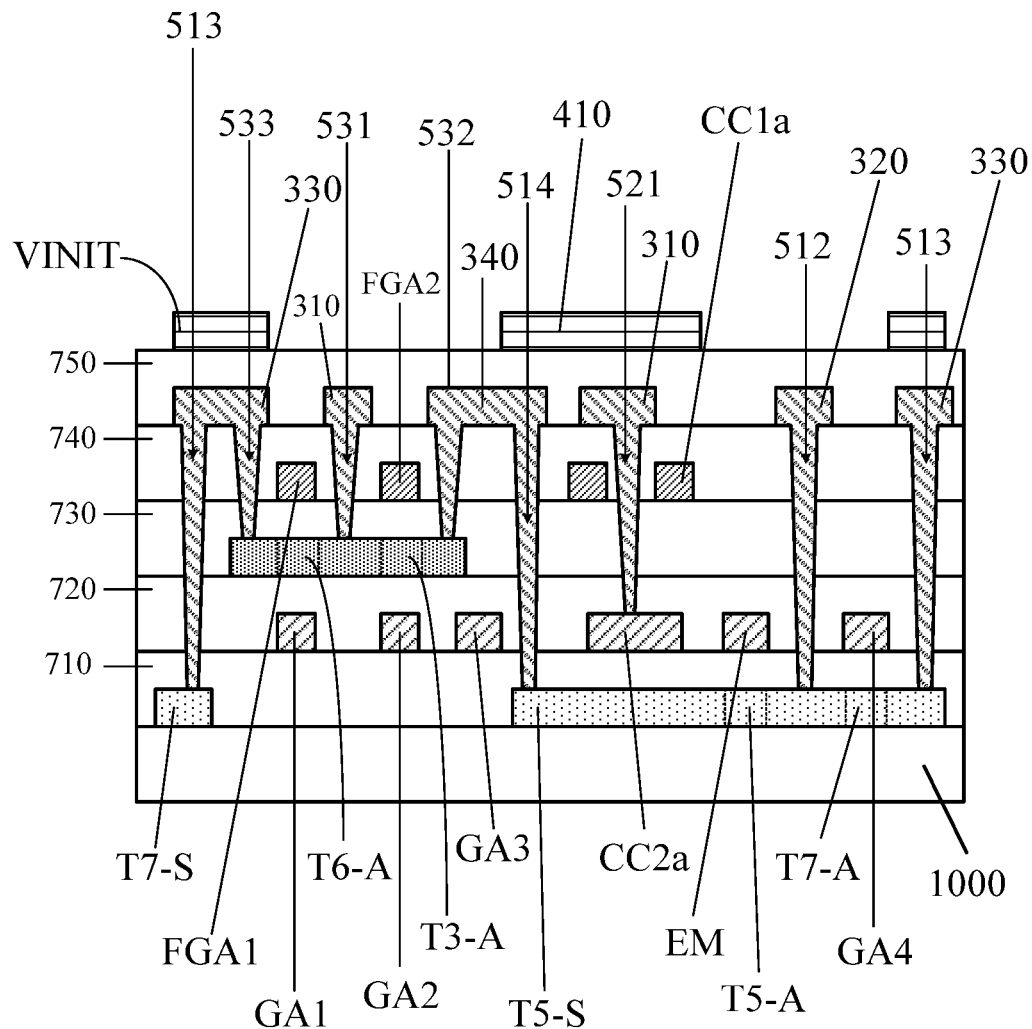
FIG. 6A is a section view in a direction AA' of the structural schematic diagram of the layout shown in FIG. 3.
Figure 6B:
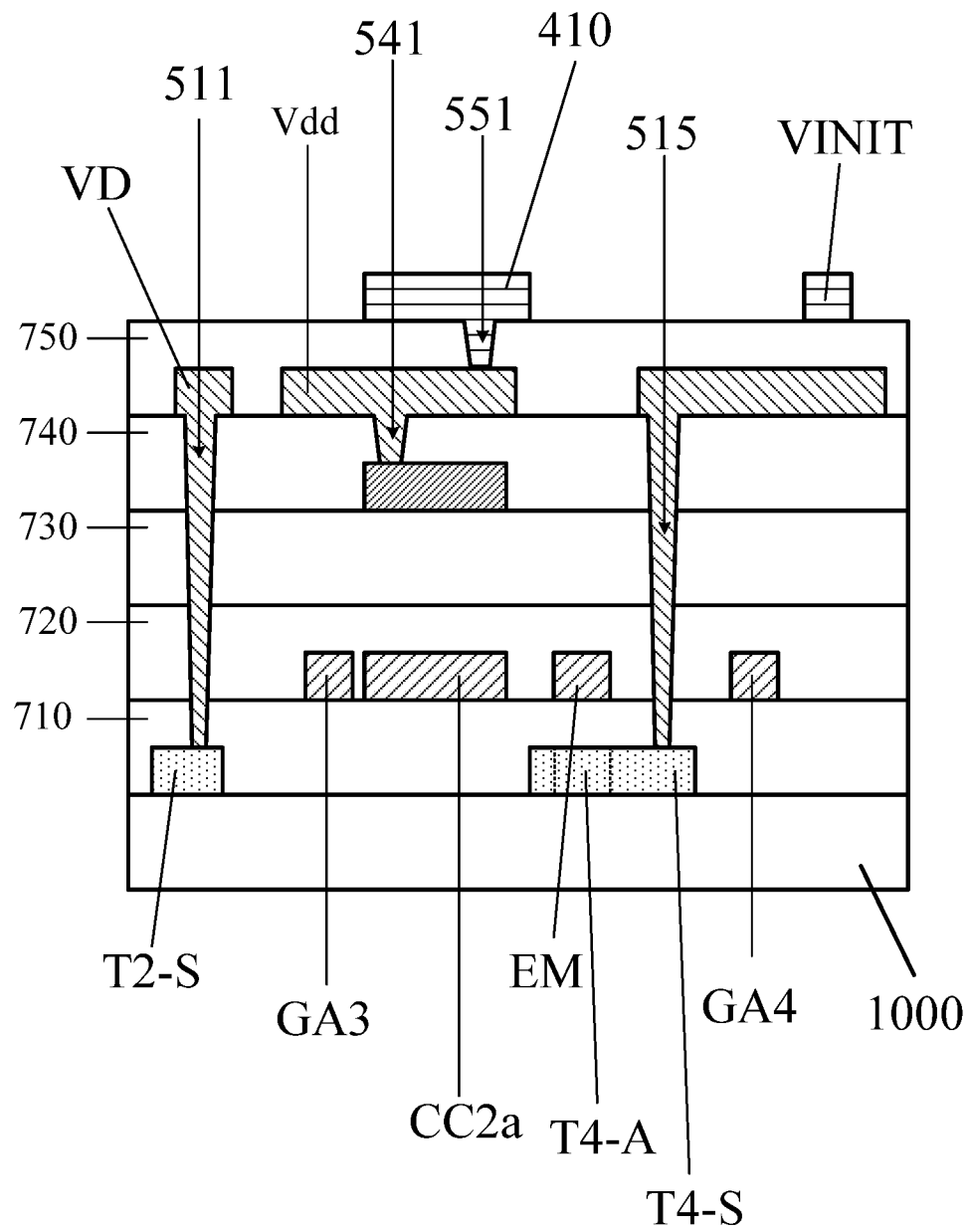
FIG. 6B is a section view in a direction BB' of the structural schematic diagram of the layout shown in FIG. 3.
Figure 6C:
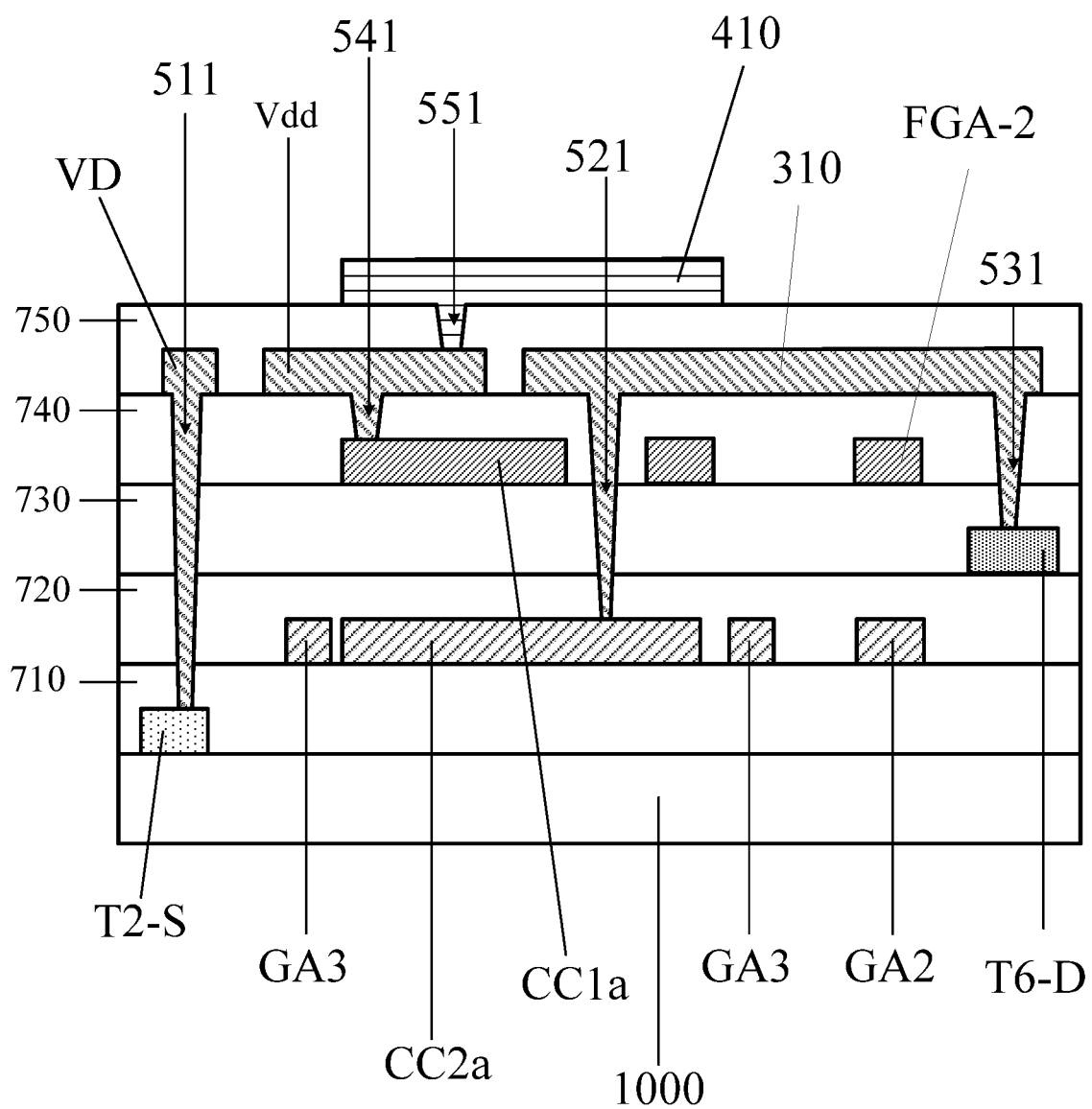
FIG. 6C is a section view in a direction CC' of the structural schematic diagram of the layout of the pixel driving circuit shown in FIG. 3.
Figure 6D:
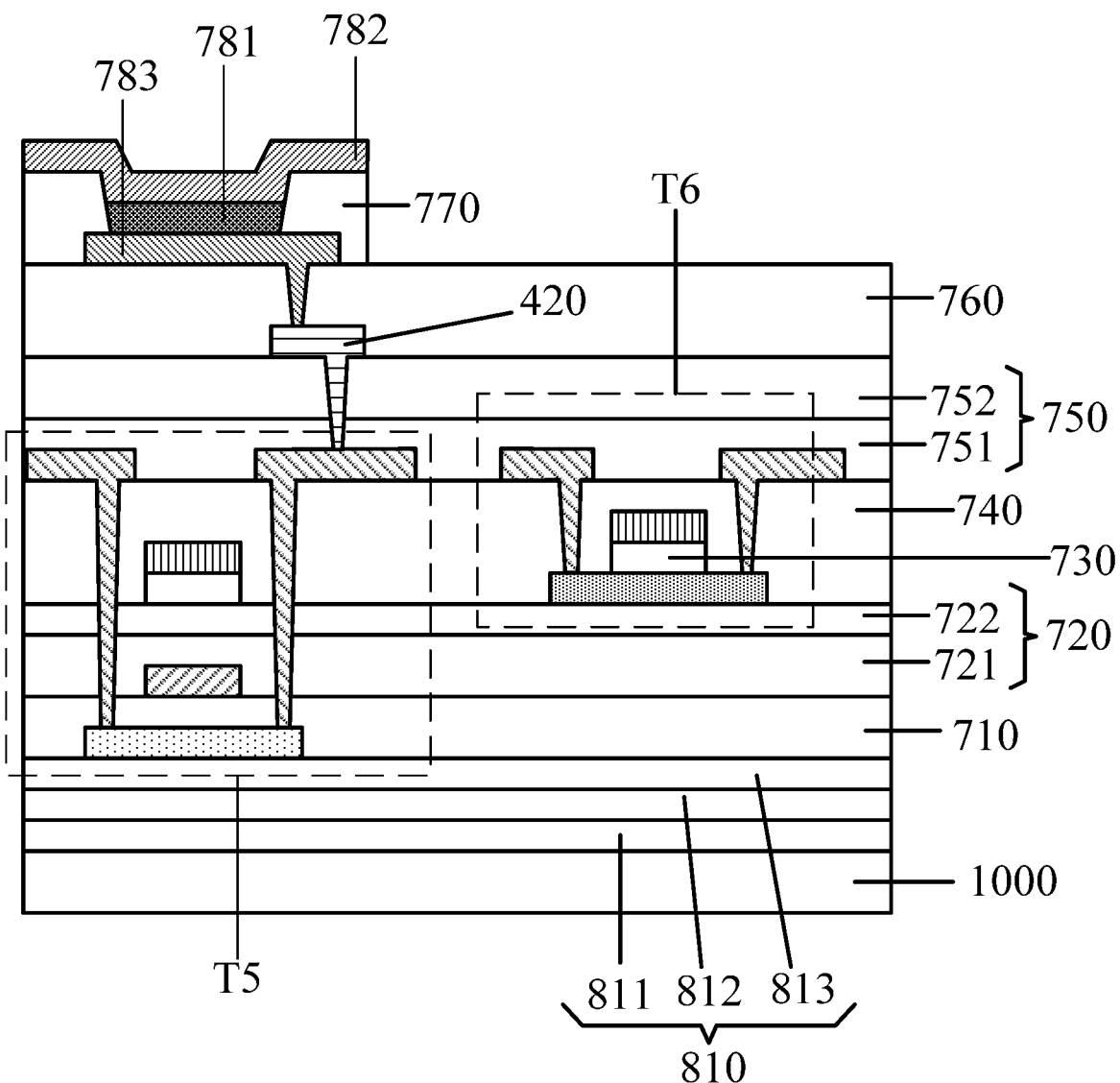
FIG. 6D is a partial section view of the structural schematic diagram of the layout of the pixel driving circuit shown in FIG. 3.
Figure 7:
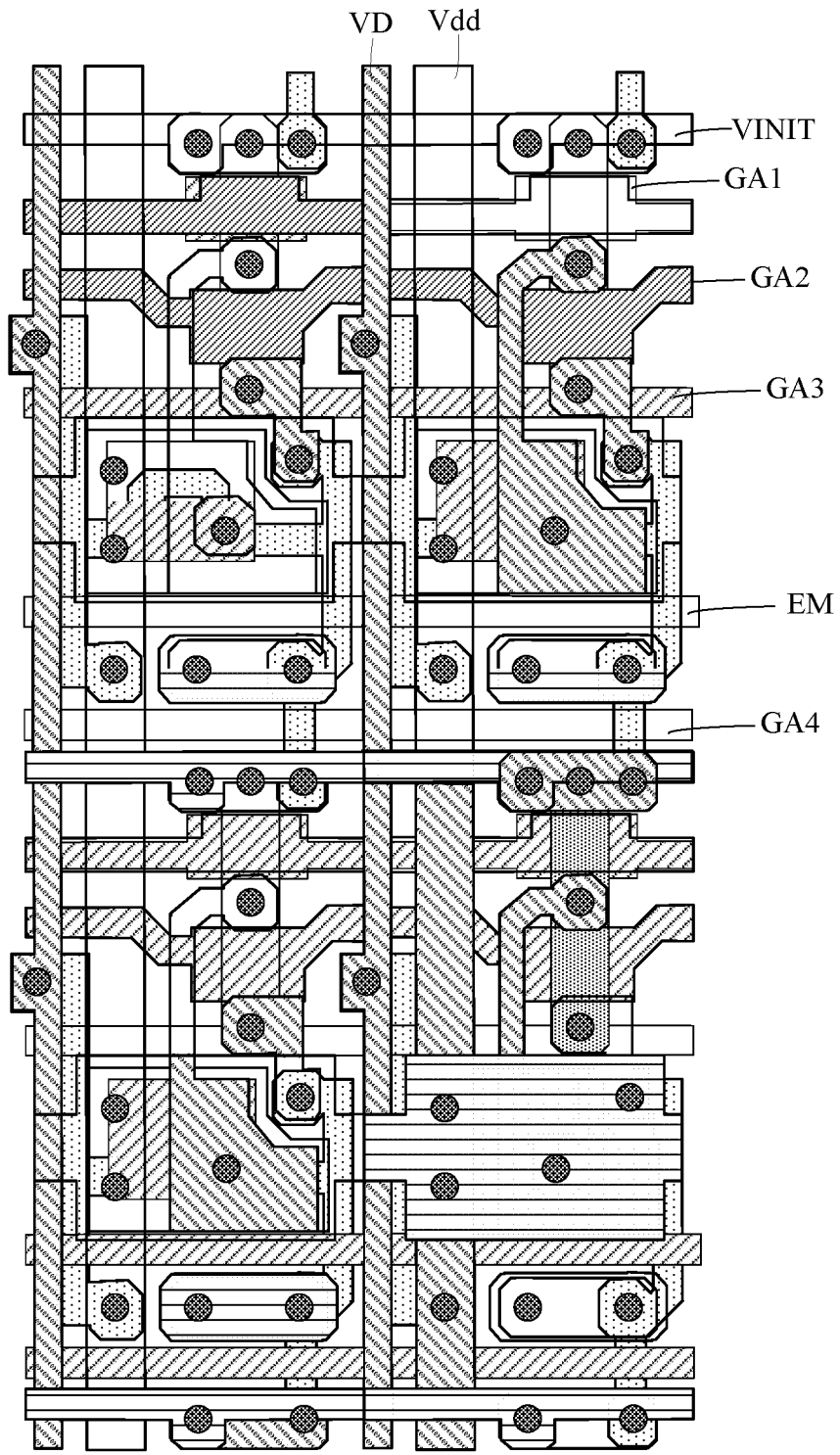
FIG. 7 is a structural schematic diagram of the layout of pixel driving circuits in two rows and two columns of sub-pixels in embodiments of the present disclosure.

FIG. 6A is a section view in a direction AA' of the structural schematic diagram of the layout shown in FIG. 3. FIG. 6B is a section view in a direction BB' of the structural schematic diagram of the layout shown in FIG. 3. FIG. 6C is a section view in a direction CC' of the structural schematic diagram of the layout shown in FIG. 3. FIG. 6D is a partial section view of the structural schematic diagram of the layout shown in FIG. 3. FIG. 7 is a structural schematic diagram of the layout of pixel driving circuits in two rows and two columns of sub-pixels in embodiments of the present disclosure. FIG. 6D illustrates only the initialization transistor T6 and the second light emitting control transistor T5 in the pixel driving circuit 0121.

As shown in FIGS. 6A to 7, a first buffer layer 810 is arranged between the silicon semiconductor layer 500 and the base substrate 1000, the first insulating layer 710 is arranged between the silicon semiconductor layer 500 and the first conductive layer 100, the second insulating layer 720 is arranged between the first conductive layer 100 and the oxide semiconductor layer 600, the third insulating layer 730 is arranged between the oxide semiconductor layer 600 and the second conductive layer 200, the fourth insulating layer 740 is arranged between the second conductive layer 200 and the third conductive layer 300, and the fifth insulating layer 750 is arranged between the third conductive layer 300 and the fourth conductive layer 400. Further, a first planarization layer 760 is arranged on a side, facing away from the base substrate 1000, of the fourth conductive layer 400, and a first electrode layer is arranged on a side, facing away from the base substrate 1000, of the first planarization layer 760. A pixel defining layer 770, a light emitting functional layer 781 and a second electrode layer 782 are sequentially arranged on a side, facing away from the base substrate 1000, of the first electrode layer. The first electrode layer may include a plurality of first electrodes 783 arranged at intervals, and the first electrodes 783 are electrically connected to the switching parts 420 through via holes penetrating through the first planarization layer 760. It should be noted that FIGS. 6A and 6B do not show the via holes penetrating through the first planarization layer 760.

Exemplarily, the above insulating layers can be made of an organic material or an inorganic material (such as SiOx and SiNx), which is not limited herein.

Exemplarily, as shown in FIG. 6D, the first buffer layer 810 may include a first sub-buffer layer 811, a second sub-buffer layer 812 and a third sub-buffer layer 813 which are stacked. The first sub-buffer layer 811 is located between the base substrate 1000 and the second sub-buffer layer 812, and the third sub-buffer layer 813 is located between the second sub-buffer layer 812 and the silicon semiconductor layer 500. Exemplarily, at least one of the first sub-buffer layer 811, the second sub-buffer layer 812 and the third sub-buffer layer 813 may be made of an inorganic material, or may be made of an organic material. For example, the first sub-buffer layer 811 is made of an organic material, such as polyimide (PI), and the second sub-buffer layer 812 and the third sub-buffer layer 813 can be made of an inorganic material, such as SiOx and SiNx.

Exemplarily, as shown in FIG. 6D, the second insulating layer 720 may include a second sub-insulating layer 721 and a second buffer layer 722 which are stacked. The second sub-insulating layer 721 is located between the first conductive layer 100 and the second buffer layer 722, and the second buffer layer 722 is located between the second sub-insulating layer 721 and the oxide semiconductor layer 600. Exemplarily, the second sub-insulating layer 721 may be made of an inorganic material. The second buffer layer 722 may be made of an inorganic material.

Exemplarily, as shown in FIG. 6D, the fifth insulating layer 750 may include a passivation layer (PVX) 751 and a second planarization layer 752 which are stacked. The passivation layer 751 is located between the third conductive layer 300 and the second planarization layer 752, and the second planarization layer 752 is located between the passivation layer 752 and the fourth conductive layer 400. Exemplarily, the passivation layer 751 may be made of an inorganic material, and the second planarization layer 752 may be made of an organic material.

Exemplarily, the sub-pixel spx may include first connecting holes 511, 512, 513, 514, and 515. The sub-pixel spx may include a second connecting hole 521. The sub-pixel spx may include third connecting holes 531, 532 and 533. The sub-pixel spx may include a fourth connecting hole 541. The sub-pixel spx may include fifth connecting holes 551, 552 and 553. The first connecting holes 511, 512, 513, 514 and 515 penetrate through the first insulating layer 710, the second insulating layer 720, the third insulating layer 730 and the fourth insulating layer 740. The second connecting hole 521 penetrates through the second insulating layer 720, the third insulating layer 730, and the fourth insulating layer 740. The third connecting holes 531, 532 and 533 penetrate through the third insulating layer 730 and the fourth insulating layer 740. The fourth connecting hole 541 penetrates through the fourth insulating layer 740. The fifth connecting holes 551, 552, and 553 penetrate through the fifth insulating layer 750. Further, the above connecting holes are arranged at intervals. Exemplarily, the first connecting hole 511 serves as a first via hole, the third connecting hole 531 serves as a second via hole, the second connecting hole 521 serves as a third via hole, the fourth connecting hole 541 serves as a fourth via hole, the fifth connecting hole 551 serves as a fifth via hole, the first connecting hole 515 serves as a sixth via hole, and the first connecting hole 512 serves as a seventh via hole.

In the same sub-pixel, the data wire VD is electrically connected to the first electrode area of the corresponding data writing transistor T2 in the silicon semiconductor layer 500 through at least one first connecting hole 511 (i.e., the first via hole).

The power wire Vdd is electrically connected to the first electrode area T4-S of the corresponding first light emitting control transistor T4 in the silicon semiconductor layer 500 through at least one first connecting hole 515 (i.e., the sixth via hole). Furthermore, the second electrode area T2-D of the silicon active layer of the data writing transistor T2 is electrically connected to the first electrode area T4-S of the silicon active layer of the first light emitting control transistor T4.

Furthermore, the power wire Vdd is also electrically connected to the first pole CC1a of the storage capacitor CST through at least one fourth connecting hole 541 (i.e., the fourth via hole).

The third connecting part 330 is electrically connected to the third electrode area T6-S of the initialization transistor T6 through at least one third connecting hole 533. The third connecting part 330 is also electrically connected to the initialization wire VINIT through at least one fifth connecting hole 552. The third connecting part 330 is also electrically connected to a first electrode area T7-S of the reset transistor T7 through at least one first connecting hole 513.

A first terminal of the first connecting part 310 is electrically connected to the fourth electrode area T6-D of the corresponding initialization transistor T6 in the oxide semiconductor layer 600 through at least one third connecting hole 531 (i.e., the second via hole). A second terminal of the first connecting part 310 is electrically connected to the gate CC2a of the driving transistor through at least one second connecting hole 521 (i.e., the third via hole). An orthographic projection of the third via hole (i.e., the second connecting hole 521) on the base substrate 1000 is located in the orthographic projection of the hollowed-out area LB on the base substrate 1000. Furthermore, the second electrode area T1-D of the silicon active layer of the driving transistor T1 is electrically connected to the first electrode area T5-S of the silicon active layer of the second light emitting control transistor T5.

The fourth connecting part 340 is electrically connected to the second electrode area T1-D of the corresponding driving transistor T1 in the silicon semiconductor layer 500 through at least one first connecting hole 514. The fourth connecting part 340 is also electrically connected to the third electrode area T3-S of the corresponding threshold compensation transistor T3 in the oxide semiconductor layer 600 through at least one third connecting hole 532.

The second connecting part 320 is electrically connected to the second electrode area T5-D of the corresponding second light emitting control transistor T5 in the silicon semiconductor layer 500 through at least one first connecting hole 512 (i.e., the seventh via hole). The second connecting part 320 is also electrically connected to the switching part 420 through at least one fifth connecting hole 553.

The auxiliary conductive part 410 is electrically connected to the power wire Vdd through at least one fifth connecting hole 551 (i.e., the fifth via hole).

The switching part is electrically connected to the first electrode of the light emitting component 0120 through at least one sixth connecting hole 561.

Exemplarily, the first connecting holes 511, 512, 513, 514 and 515 in the sub-pixel may be one or two or more, respectively, which can be determined according to the requirements of the actual application environment, and is not limited herein.

Exemplarily, one or two or more second connecting holes 521 may be provided in the sub-pixel, which can be determined according to the requirements of the actual application environment, and is not limited herein.

Exemplarily, the third connecting holes 531, 532 and 533 in the sub-pixel may be one or two or more, respectively, which can be determined according to the requirements of the actual application environment, and is not limited herein.

Exemplarily, the fourth connecting holes 541 in the sub-pixel may be one or two or more, respectively, which can be determined according to the requirements of the actual application environment, and is not limited herein.

Exemplarily, the fifth connecting holes 551, 552 and 553 in the sub-pixel may be one or two or more, respectively, which can be determined according to the requirements of the actual application environment, and is not limited herein.

It should be noted that the positional relationship between the transistors in each sub-pixel spx is not limited to the examples shown in FIGS. 3 to 4F, and the positions of the transistors can be specifically set according to specific application requirements.

It should be noted that the first direction F1 may be the row direction of the sub-pixels, and the second direction F2 may be the column direction of the sub-pixels. Or, the first direction F1 may be the column direction of the sub-pixels, and the second direction F2 may be the row direction of the sub-pixels. In practical application, this can be determined according to the actual application requirements, which is not limited herein.

Exemplarily, as shown in FIGS. 3 and 6B, in the same sub-pixel, the orthographic projection of the second channel area T3-A of the oxide active layer of the threshold compensation transistor T3 in the column direction F2 is overlapped with an orthographic projection of the first via hole (i.e., the first connecting hole 511) in the column direction F2.

Exemplarily, as shown in FIGS. 3 and 6B, in the same sub-pixel, the orthographic projection of the storage conductive part CC1a on the base substrate 1000 covers an orthographic projection of the fifth via hole (i.e., the fifth connecting hole 551) on the base substrate 1000. Further, in the same sub-pixel, the orthographic projection of the storage conductive part CC1a on the base substrate 1000 covers an orthographic projection of the fourth via hole (i.e., the fourth connecting hole 541) on the base substrate 1000. Further, the orthographic projection of the storage conductive part CC1a on the base substrate 1000 is close to the orthographic projection of the light emitting control wire EM on the base substrate 1000, and the orthographic projection of the storage conductive part CC1a on the base substrate 1000 does not overlap with the orthographic projection of the light emitting control wire EM on the base substrate 1000.

Exemplarily, as shown in FIGS. 3 and 6B, in the same column, the fourth via hole (i.e., the fourth connecting hole 541) and the fifth via hole (i.e., the fifth connecting hole 551) are arranged roughly on the same straight line in the column direction F2. Further, in the same column, the sixth via hole (i.e., the first connecting hole 515), the fourth via hole (i.e., the fourth connecting hole 541), and the fifth via hole (i.e., the fifth connecting hole 551) are arranged roughly on the same straight line in the column direction F2.

Exemplarily, as shown in FIGS. 3 and 4E, the orthographic projection of the first connecting part 310 on the base substrate 1000 is close to the orthographic projection of the power wire Vdd on the base substrate 1000, and the orthographic projection of the first connecting part 310 on the base substrate 1000 does not overlap with the orthographic projection of the power wire Vdd on the base substrate 1000.

Exemplarily, as shown in FIGS. 3, 6A and 6B, in the same sub-pixel, the orthographic projection of the fourth scanning wire GA4 on the base substrate 1000 is located on a side, facing away from the orthographic projection of the light emitting control wire EM on the base substrate 1000, of the orthographic projections of the seventh via hole (i.e., the first connecting hole 512) and the sixth via hole (i.e., the first connecting hole 515) on the base substrate 1000.

In specific implementation, in the embodiments of the present disclosure, the storage capacitor is provided with three electrode plates which are stacked, and the three electrode plates are respectively arranged on the same layer together with the first conductive layer, the second conductive layer and the third conductive layer. In this way, an area of the storage capacitor CST and a capacitance value of the storage capacitor CST can be increased without enlarging the occupied area.

In specific implementation, in the embodiments of the present disclosure, in the same sub-pixel, the gate of the driving transistor, the storage conductive part and the first connecting part serve as the three electrode plates of the storage capacitor. Further, the first connecting part is electrically connected to the gate of the driving transistor to serve as the second pole of the storage capacitor.

Figure 8:
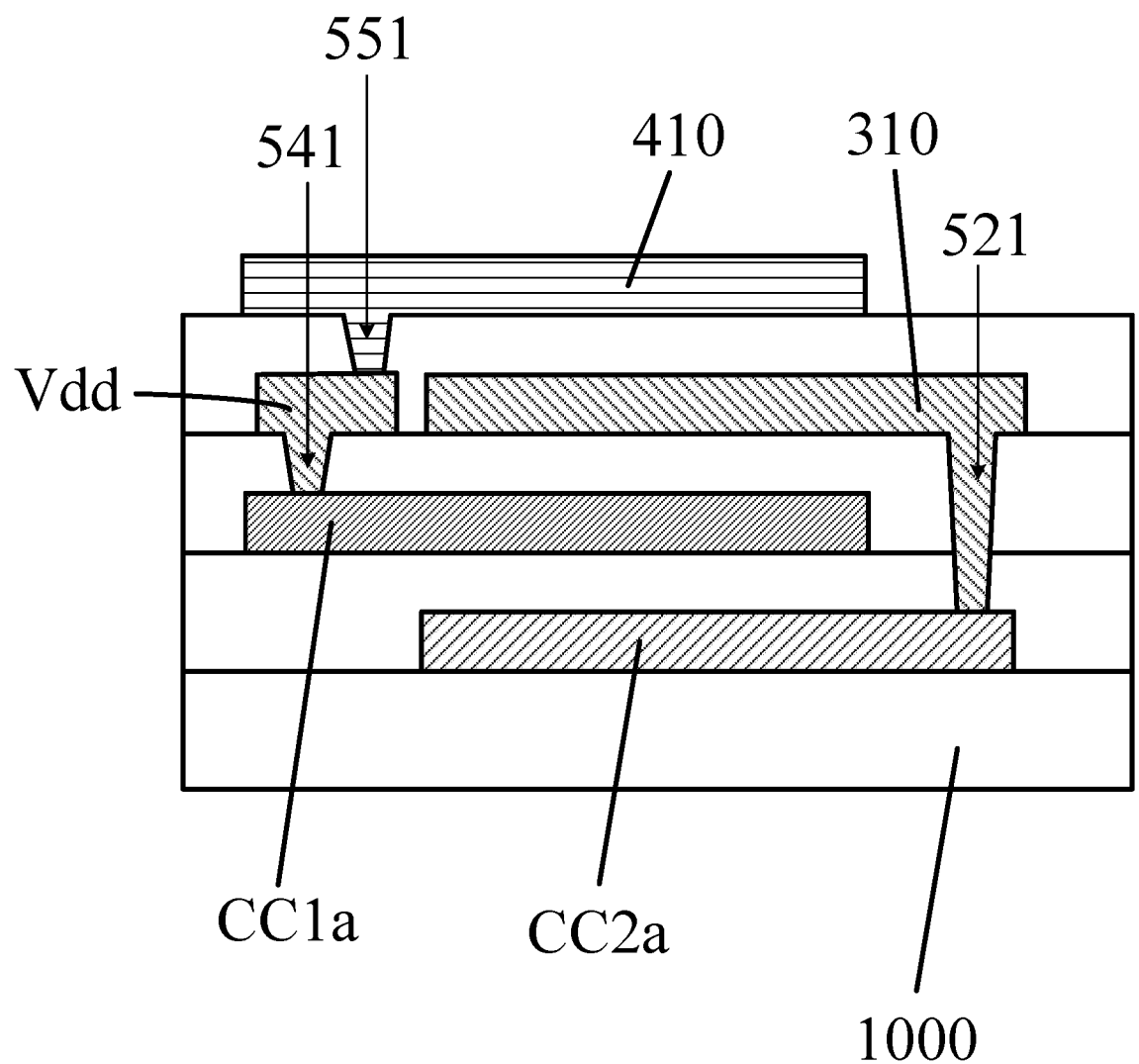
FIG. 8 is a structural schematic diagram of a storage capacitor in embodiments of the present disclosure.

Further, as shown in FIG. 8, the auxiliary conductive part 410, the storage conductive part CC1a and the power wire Vdd in the same sub-pixel are electrically connected to form the first pole of the storage capacitor CST, so that the auxiliary conductive part 410 and the storage conductive part CC1a have the same potential which is the potential of the power wire Vdd. In addition, the gate CC2a of the driving transistor T1 is electrically connected to the first connecting part 310 to form the second pole of the storage capacitor CST, so that the gate CC2a of the driving transistor T1 and the first connecting part 310 have the same potential which is the potential of the gate CC2a of the driving transistor T1. In this way, the storage capacitor can include four electrode plates which are stacked, so that the area of the storage capacitor CST and the capacitance value of the storage capacitor CST can be increased without enlarging the occupied area.

In specific implementation, the second planarization layer 752 at the position corresponding to the auxiliary conductive part 410 and the first connecting part 310 can be thinned or removed, so that the capacitance value of the storage capacitor CST can be increased.

It should be noted that in the actual process, due to the limitation of process conditions or other factors, as for the above feature of extending on the same straight line, extending on exactly the same straight line is impossible in actual preparation, and certain deviation may exist. Therefore, it belongs to the protection scope of the present disclosure as long as the extension is roughly on the same straight line. For example, the feature of extending on the same straight line can have an allowable error range.

Based on the same inventive concept, an embodiment of the present disclosure also provides a display device, including the above display panel provided by the embodiments of the present disclosure. The principle of the display device for solving problems is similar to that of the aforementioned display panel, so that the display device can be implemented with reference to the implementation of the aforementioned display panel, and repetition parts will not be repeated herein.

In specific implementation, in the embodiments of the present disclosure, the display device may be any product or component with a display function such as a mobile phone, a tablet computer, a television, a display, a notebook computer, a digital photo frame, and a navigator. Other essential components of the display device should be understood by those of ordinary skill in the art, and are not described in detail herein, nor should they be taken as limitations to the present disclosure.

Although the preferred embodiments of the present disclosure have been described, those skilled in the art can make additional changes and modifications to these embodiments once they know the basic inventive concepts. Therefore, the appended claims are intended to be interpreted as including the preferred embodiment and all changes and modifications that fall within the scope of the present disclosure.

Obviously, those skilled in the art can make various changes and modifications to the embodiments of the present disclosure without departing from the spirit and scope of the embodiments of the present disclosure. Thus, the present disclosure is also intended to include such changes and variations if they fall within the scope of the claims of the present disclosure and their equivalents.

What is claimed is:

1. A display panel, comprising:
a base substrate, comprising a plurality of sub-pixels, wherein at least one of the plurality of sub-pixels comprises a pixel circuit, the pixel circuit comprises a storage capacitor, an initialization transistor and a threshold compensation transistor;
a silicon semiconductor layer located on the base substrate, wherein the silicon semiconductor layer comprises a silicon active layer of a driving transistor, the silicon active layer comprises a first electrode area, a second electrode area and a first channel area between the first electrode area and the second electrode area;
a first insulating layer located on a side, facing away from the silicon semiconductor layer, of the base substrate;
a first conductive layer located on a side, facing away from the base substrate, of the first insulating layer, wherein the first conductive layer comprises a plurality of scanning wires;
a second insulating layer located on a side, facing away from the base substrate, of the first conductive layer;
an oxide semiconductor layer located on a side, facing away from the base substrate, of the second insulating layer, wherein the oxide semiconductor layer comprises an oxide active layer of the initialization transistor and an oxide active layer of the threshold compensation transistor, the oxide active layer of the threshold compensation transistor comprises a third electrode area, a fourth electrode area and a second channel area between the third electrode area and the fourth electrode area, and in each sub-pixel, a fourth electrode area of the oxide active layer of the initialization transistor and the fourth electrode area of the oxide active layer of the threshold compensation transistor are electrically connected to a gate of the driving transistor, and the third electrode area of the oxide active layer of the threshold compensation transistor is electrically connected to the second electrode area of the silicon active layer of the driving transistor;
a third insulating layer located on a side, facing away from the base substrate, of the oxide semiconductor layer;
a second conductive layer located on a side, facing away from the base substrate, of the third insulating layer;
a fourth insulating layer located on a side, facing away from the base substrate, of the second conductive layer; and
a third conductive lay located on a side, facing away from the base substrate, of the fourth insulating layer, wherein the third conductive layer comprises a plurality of data wires arranged at intervals;
wherein the storage capacitor comprises three stacked electrode plates, and the three electrode plates are respectively arranged on the same layer together with the first conductive layer, the second conductive layer and the third conductive layer.

2. The display panel according to claim 1, wherein the pixel circuit further comprises the driving transistor, and the first conductive layer further comprises the gate of the driving transistor;
the second conductive layer comprises a plurality of storage conductive parts arranged at intervals, wherein the sub-pixel comprises the storage conductive part;

the third conductive layer further comprises a plurality of first connecting parts arranged at intervals, wherein the sub-pixel comprises the first connecting part; and in a same sub-pixel, the gate of the driving transistor, the storage conductive part and the first connecting part serve as the three electrode plates of the storage capacitor.

3. The display panel according to claim 1, wherein in the same sub-pixel, an orthographic projection of the storage conductive part on the base substrate and an orthographic projection of the gate of the driving transistor on the base substrate have a sixth overlapping area, and the first connecting part is electrically connected to the gate of the driving transistor;

the storage conductive part serves as a first pole of the storage capacitor; and the first connecting part is electrically connected to the gate of the driving transistor and serves as a second pole of the storage capacitor.

4. The display panel according to claim 3, wherein the storage conductive part comprises a hollowed-out area, and the orthographic projection of the gate of the driving transistor on the base substrate covers the hollowed-out area of the storage conductive part;

a first terminal of the first connecting part is electrically connected to the fourth electrode area of the oxide active layer of the initialization transistor through a second via hole, and a second terminal of the first connecting part is electrically connected to the gate of the driving transistor through a third via hole;

the second via hole penetrates through the third insulating layer and the fourth insulating layer; and the third via hole penetrates through the second insulating layer, the third insulating layer and the fourth insulating layer, and an orthographic projection of the third via hole on the base substrate is located in an orthographic projection of the hollowed-out area on the base substrate.

5. The display panel according to claim 4, wherein an orthographic projection of the first connecting part on the base substrate covers the orthographic projection of the hollowed-out area on the base substrate.

6. The display panel according to claim 2, wherein the third conductive layer further comprises a plurality of power wires arranged at intervals; one column of the sub-pixels comprises the power wire, and in a same column, an orthographic projection of the power wire on the base substrate is located between an orthographic projection of the data wire on the base substrate and an orthographic projection of the first connecting part on the base substrate; and in the same sub-pixel, the power wire is electrically connected to the storage conductive part through a fourth via hole, and the fourth via hole penetrates through the fourth insulating layer.

7. The display panel according to claim 6, wherein the display panel further comprises:

a fifth insulating layer located on a side, facing away from the base substrate, of the third conductive layer; and a fourth conductive layer located on a side, facing away from the base substrate, of the fifth insulating layer, wherein the fourth conductive layer comprises a plurality of auxiliary conductive parts arranged at intervals, and the sub-pixel comprises the auxiliary conductive part;

wherein in the same sub-pixel, the auxiliary conductive part is electrically connected to the power wire through a fifth via hole, and an orthographic projection of the auxiliary conductive part on the base substrate is overlapped with the orthographic projection of the first connecting part on the base substrate, wherein the fifth via hole penetrates through the fifth insulating layer.

8. The display panel according to claim 7, wherein in the same sub-pixel, the orthographic projection of the auxiliary conductive part on the base substrate covers the orthographic projection of the storage conductive part on the base substrate.

9. The display panel according to claim 8, wherein in the same sub-pixel, the orthographic projection of the storage conductive part on the base substrate covers an orthographic projection of the fifth via hole on the base substrate.

10. The display panel according to claim 7, wherein in the same column, the fourth via hole and the fifth via hole are located roughly on a same straight line in a column direction.

11. The display panel according claim 1, wherein in the at least one of the plurality of sub-pixels, the fourth electrode area of the oxide active layer of the initialization transistor is shared with the fourth electrode area of the oxide active layer of the threshold compensation transistor, and the oxide active layer of the initialization transistor and the oxide active layer of the threshold compensation transistor extend roughly on a same straight line in the column direction of the sub-pixels.

12. The display panel according to claim 11, wherein in a same row of the sub-pixels, the oxide active layers of the initialization transistors are located roughly on a same straight line in a row direction of the sub-pixels, and the oxide active layers of the threshold compensation transistors are located roughly on the same straight line in the row direction of the sub-pixels.

13. The display panel according to claim 12, wherein in the same row of the sub-pixels, centers of the second channel areas of the oxide active layers of the initialization transistors are located roughly on a same straight line in the row direction of the sub-pixels, and centers of the second channel areas of the oxide active layers of the threshold compensation transistors are located roughly on the same straight line in the row direction of the sub-pixels.

14. The display panel according to claim 11, wherein in the same column of the sub-pixels, the oxide active layer of the initialization transistor and the oxide active layer of the threshold compensation transistor extend roughly on a same straight line in the column direction of the sub-pixels.

15. The display panel according to claim 11, wherein the plurality of scanning wires comprise a plurality of first scanning wires and a plurality of second scanning wires, arranged at intervals, wherein one row of the sub-pixels comprises the first scanning wire and the second scanning wire;

in the same sub-pixel, an orthographic projection of the first scanning wire on the base substrate and an orthographic projection of the second channel area of the oxide active layer of the initialization transistor on the base substrate have a first overlapping area, and a part, located in the first overlapping area, of the first scanning wire serves as a gate of the initialization transistor; and in the same sub-pixel, an orthographic projection of the second scanning wire on the base substrate and an orthographic projection of the second channel area of the oxide active layer of the threshold compensation transistor on the base substrate have a second overlapping area, and a part, located in the second overlapping area, of the second scanning wire serves as a gate of the threshold compensation transistor.

16. The display panel according to claim 15, wherein the pixel circuit further comprises a data writing transistor, and the silicon semiconductor layer further comprises a silicon active layer of the data writing transistor; and the data wire is electrically connected to a first electrode area of the silicon active layer of the data writing transistor through a first via hole, and the first via hole penetrates through the first insulating layer, the second insulating layer, the third insulating layer and the fourth insulating layer.

17. The display panel according to claim 16, wherein in the same sub-pixel, an orthographic projection of the second channel area of the oxide active layer of the threshold compensation transistor in the column direction is overlapped with an orthographic projection of the first via hole in the column direction.

18. The display panel according to claim 17, wherein the plurality of scanning wires comprise a plurality of third scanning wires arranged at intervals, wherein one row of the sub-pixels comprises the third scanning wire; and in the same sub-pixel, an orthographic projection of the third scanning wire on the base substrate and an orthographic projection of a first channel area of the silicon active layer of the data writing transistor on the base substrate have a third overlapping area, and a part, located in the third overlapping area, of the third scanning wire serves as a gate of the data writing transistor.

19. The display panel according to claim 18, wherein in the same sub-pixel, the orthographic projection of the second scanning wire on the base substrate is located between the orthographic projection of the first scanning wire on the base substrate and the orthographic projection of the third scanning wire on the base substrate.

20. The display panel according to claim 19, wherein in the same sub-pixel, the orthographic projection of the third scanning wire on the base substrate is overlapped with an orthographic projection of the third electrode area of the oxide active layer of the threshold compensation transistor on the base substrate.

21. The display panel according to claim 16, wherein the second conductive layer further comprises a plurality of first auxiliary scanning wires arranged at intervals, wherein one row of the sub-pixels comprises the first auxiliary scanning wire;

in the same sub-pixel, an orthographic projection of the first auxiliary scanning wire on the base substrate and the orthographic projection of the second channel area of the oxide active layer of the initialization transistor on the base substrate have a fourth overlapping area; and the initialization transistor is a double-gate transistor, wherein a part, located in the first overlapping area, of the first scanning wire is a first gate of the initialization transistor, and a part, located in the fourth overlapping area, of the first auxiliary scanning wire is a second gate of the initialization transistor.

22. The display panel according to claim 21, wherein in the same row, the orthographic projection of the first scanning wire on the base substrate covers the orthographic projection of the first auxiliary scanning wire on the base substrate.

23. The display panel according to claim 16, wherein the second conductive layer further comprises a plurality of second auxiliary scanning wires arranged at intervals, wherein one row of the sub-pixels comprises the second auxiliary scanning wire;

in the same sub-pixel, an orthographic projection of the second auxiliary scanning wire on the base substrate and the orthographic projection of the second channel area of the oxide active layer of the threshold compensation transistor on the base substrate have a fifth overlapping area; and the threshold compensation transistor is a double-gate transistor, wherein a part, located in the second overlapping area, of the second scanning wire is a first gate of the threshold compensation transistor, and a part, located in the fifth overlapping area, of the second auxiliary scanning wire is a second gate of the threshold compensation transistor.

24. The display panel according to claim 23, wherein in the same row, the orthographic projection of the second scanning wire on the base substrate covers the orthographic projection of the second auxiliary scanning wire on the base substrate.

25. The display panel according to claim 1, wherein the third conductive layer further comprises a plurality of switching parts arranged at intervals, and the sub-pixel comprises the switching part;

the pixel circuit further comprises a first light emitting control transistor and a second light emitting control transistor, and the silicon semiconductor layer further comprises a silicon active layer of the first light emitting control transistor and a silicon active layer of the second light emitting control transistor; and in the same sub-pixel, a second electrode area of the silicon active layer of the data writing transistor is electrically connected to a first electrode area of the silicon active layer of the first light emitting control transistor, and the power wire is electrically connected to a second electrode area of the silicon active layer of the first light emitting control transistor through a sixth via hole; and the second electrode area of the silicon active layer of the driving transistor is electrically connected to a first electrode area of the silicon active layer of the second light emitting control transistor, and a second electrode area of the silicon active layer of the second light emitting control transistor is electrically connected to the switching part through a seventh via hole, wherein the sixth via hole and the seventh via hole penetrate through the first insulating layer, the second insulating layer, the third insulating layer and the fourth insulating layer.

26. The display panel according to claim 25, wherein the first conductive layer further comprises a plurality of light emitting control wires arranged at intervals, wherein one row of the sub-pixels comprises the light emitting control wire;

in the same sub-pixel, an orthographic projection of the light emitting control wire on the base substrate is located on a side, facing away from the orthographic projection of the third scanning wire on the base substrate, of the orthographic projection of the gate of the driving transistor on the base substrate;

in the same sub-pixel, the orthographic projection of the light emitting control wire on the base substrate and an orthographic projection of a first channel area of the silicon active layer of the first light emitting control transistor on the base substrate have a seventh overlapping area, and a part, located in the seventh overlapping area, of the light emitting control wire serves as a gate of the first light emitting control transistor; and in the same sub-pixel, the orthographic projection of the light emitting control wire on the base substrate and an orthographic projection of a first channel area of the silicon active layer of the second light emitting control transistor on the base substrate have an eighth overlapping area, and a part, located in the eighth overlapping area, of the light emitting control wire serves as a gate of the second light emitting control transistor.

27. The display panel according to claim 26, wherein in the same sub-pixel, the orthographic projection of the auxiliary conductive part on the base substrate and an edge of the orthographic projection of the light emitting control wire on the base substrate has an overlapping area; and the orthographic projection of the storage conductive part on the base substrate does not overlap with the orthographic projection of the light emitting control wire on the base substrate.

28. The display panel according to claim 27, wherein the fourth conductive layer further comprises a plurality of initialization wires arranged at intervals, wherein one row of the sub-pixels comprises the initialization wire, and in the same sub-pixel, a third electrode area of the oxide active layer of the initialization transistor is electrically connected to the initialization wire; and in the same sub-pixel, an orthographic projection of the initialization wire on the base substrate is located on a side, facing away from the orthographic projection of the second scanning wire on the base substrate, of the orthographic projection of the first scanning wire on the base substrate.

29. The display panel according to claim 28, wherein the pixel circuit further comprises a reset transistor, and the silicon semiconductor layer further comprises a silicon active layer of the reset transistor;

the first conductive layer further comprises a plurality of fourth scanning wires arranged at intervals, wherein one row of the sub-pixels corresponds to one of the fourth scanning wires; in the same sub-pixel, an orthographic projection of the fourth scanning wire on the base substrate is located on a side, facing away from the orthographic projection of the light emitting control wire on the base substrate, of orthographic projections of the seventh via hole and the sixth via hole on the base substrate; and in the same sub-pixel, the orthographic projection of the fourth scanning wire on the base substrate and an orthographic projection of a first channel area of the silicon active layer of the reset transistor on the base substrate have a ninth overlapping area, and a part, located in the ninth overlapping area, of the fourth scanning wire serves as a gate of the reset transistor.

30. A display device, comprising a display panel, wherein the display panel comprises:

a base substrate, comprising a plurality of sub-pixels, wherein at least one of the plurality of sub-pixels comprises a pixel circuit, the pixel circuit comprises a storage capacitor, an initialization transistor and a threshold compensation transistor;

a silicon semiconductor layer located on the base substrate, wherein the silicon semiconductor layer comprises a silicon active layer of a driving transistor, the silicon active layer comprises a first electrode area, a second electrode area and a first channel area between the first electrode area and the second electrode area;

a first insulating layer located on a side, facing away from the silicon semiconductor layer, of the base substrate;

a first conductive layer located on a side, facing away from the base substrate, of the first insulating layer, wherein the first conductive layer comprises a plurality of scanning wires;

a second insulating layer located on a side, facing away from the base substrate, of the first conductive layer;

an oxide semiconductor layer located on a side, facing away from the base substrate, of the second insulating layer, wherein the oxide semiconductor layer comprises an oxide active layer of the initialization transistor and an oxide active layer of the threshold compensation transistor, the oxide active layer of the threshold compensation transistor comprises a third electrode area, a fourth electrode area and a second channel area between the third electrode area and the fourth electrode area, and in each sub-pixel, a fourth electrode area of the oxide active layer of the initialization transistor and the fourth electrode area of the oxide active layer of the threshold compensation transistor are electrically connected to a gate of the driving transistor, and the third electrode area of the oxide active layer of the threshold compensation transistor is electrically connected to the second electrode area of the silicon active layer of the driving transistor;

a third insulating layer located on a side, facing away from the base substrate, of the oxide semiconductor layer;

a second conductive layer located on a side, facing away from the base substrate, of the third insulating layer;

a fourth insulating layer located on a side, facing away from the base substrate, of the second conductive layer; and a third conductive lay located on a side, facing away from the base substrate, of the fourth insulating layer, wherein the third conductive layer comprises a plurality of data wires arranged at intervals;

wherein the storage capacitor comprises three stacked electrode plates, and the three electrode plates are respectively arranged on the same layer together with the first conductive layer, the second conductive layer and the third conductive layer.

* * * * *